(12) United States Patent
Jung et al.

(10) Patent No.: US 7,285,831 B2
(45) Date of Patent: Oct. 23, 2007

(54) CMOS DEVICE WITH IMPROVED PERFORMANCE AND METHOD OF FABRICATING THE SAME

(75) Inventors: Mu-kyeng Jung, Suwon-si (KR); Hee-sung Kang, Seongnam-si (KR); Hyuk-ju Ryu, Seoul (KR); Woo-young Chung, Seongnam-si (KR); Kyung-soo Kim, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/179,434

(22) Filed: Jul. 12, 2005

(65) Prior Publication Data

US 2006/0027876 A1 Feb. 9, 2006

(30) Foreign Application Priority Data

Aug. 3, 2004 (JP) .................. 10-2004-0061161

(51) Int. Cl.
*H01L 29/94* (2006.01)
(52) U.S. Cl. ................. 257/374; 257/206; 257/E27.062
(58) Field of Classification Search ................ 257/369, 257/374, 401, 510, E27.064, E27.108, E29.02, 257/204, 206, 371, 372, E27.062, E27.063, 257/E27.067
See application file for complete search history.

(56) References Cited

U.S. PATENT DOCUMENTS 4,727,045 A * 2/1988 Cheung et al. ............. 438/384

| | | | |
|---|---|---|---|
| 5,763,926 A | 6/1998 | Yamamoto et al. ......... 257/401 |
| 6,399,434 B1 * | 6/2002 | Chaloux et al. ............ 438/243 |
| 6,608,744 B1 * | 8/2003 | Kato .......................... 361/111 |
| 6,974,981 B2 * | 12/2005 | Chidambarrao et al. .... 257/265 |
| 2002/0177260 A1 * | 11/2002 | Matsumoto ................. 438/154 |
| 2004/0075141 A1 * | 4/2004 | Maeda et al. ................ 257/347 |

FOREIGN PATENT DOCUMENTS

| JP | 3-225963 | 10/1991 |
| JP | 2002-231951 | 8/2002 |
| JP | 2003-142681 | 5/2003 |

* cited by examiner

*Primary Examiner*—Minhloan Tran
*Assistant Examiner*—Benjamin Tzu-Hung Liu
(74) *Attorney, Agent, or Firm*—Mills & Onello LLP

(57) ABSTRACT

A complementary metal oxide semiconductor (CMOS) device having improved performance includes a first device active region including at least one pair of transistor active regions wherein one transistor active region has a first width and the other transistor active region for forming a contact has a second width, a first gate arranged on the first device active region, a MOS transistor of a first conductivity type including a source/drain region of the first conductivity type formed in the first device active region, a second device active region having a third width greater than the first width, a second gate arranged on the second device active region, and a MOS transistor of a second conductivity type including a source/drain region of the second conductivity type formed in the second device active region.

20 Claims, 22 Drawing Sheets

CMOS DEVICE WITH IMPROVED PERFORMANCE AND METHOD OF FABRICATING THE SAME

This application claims priority from Korean Patent Application No. 10-2004-0061161 filed on Aug. 3, 2004 in the Korean Intellectual Property Office, the contents of which are incorporated herein by reference in their entirety.

BACKGROUND OF THE INVENTION

1. Field of the Invention

The present invention relates to a semiconductor device and method of fabricating the same, and more particularly, to a complementary metal oxide semiconductor (CMOS) device having improved performance and a method of fabricating the same.

2. Description of the Related Art

A CMOS device comprises both N-type MOS (NMOS) and P-type MOS (PMOS) transistors. The major carriers are electrons in the NMOS transistor while the major carriers are holes in the PMOS transistor. Thus, in order to improve the overall performance of the CMOS device, a balance between performance of NMOS and PMOS transistors within the CMOS device must be achieved.

It is generally known that electron mobility in a semiconductor substrate is about 2 to 2.5 times higher than hole mobility in the semiconductor substrate. Thus, a conventional CMOS device is designed such that a channel width of a PMOS transistor is about 2 to 2.5 times greater than that of an NMOS transistor.

Nevertheless, since electrons and holes respond to external stresses in opposite directions, an imbalance in performance between PMOS and NMOS transistors is unavoidably generated.

Therefore, development of a CMOS device having improved performance while still employing a conventional stable CMOS fabrication process without requiring a separate process of eliminating the imbalance in transistor performance would be highly desirable.

SUMMARY OF THE INVENTION

The present invention provides a complementary metal oxide semiconductor (CMOS) device having improved performance.

The present invention also provides a method of fabricating a complementary metal oxide semiconductor (CMOS) device having improved performance.

1. According to a first aspect, the invention is directed to a complementary metal oxide semiconductor (CMOS) device. The device includes a first device active region including at least one pair of transistor active regions wherein one transistor active region has a first width and the other transistor active region for forming a contact has a second width. A first gate is arranged on the first device active region, and a MOS transistor of a first conductivity type including a source/drain region of the first conductivity type is formed in the first device active region. A second device active region has a third width greater than the first width. A second gate is arranged on the second device active region. A MOS transistor of a second conductivity type including a source/drain region of the second conductivity type is formed in the second device active region.

In one embodiment, the first and second device active regions are formed within a substrate and defined by a trench isolation region filled with an insulating material having compressive stress, and the first and second conductivity types are P-type and N-type, respectively. The insulating material having compressive stress can be TEOS-$O_3$ based PECVD oxide, $SiH_4$ based PECVD oxide, high density plasma oxide, or SiON containing nitride with a molar fraction of less than 0.05.

In one embodiment, the first and second device active regions are formed within a substrate and defined by a trench isolation region filled with an insulating material having tensile stress, and the first and second conductivity types are N-type and P-type, respectively. The insulating material with tensile stress can be TEOS-$O_3$ based CVD oxide or SiON containing nitride with a molar fraction of greater than 0.05.

In one embodiment, the second width is substantially equal to the third width.

In one embodiment, the same signal is applied to the first and second gates.

In accordance with another aspect, the invention is directed to a complementary metal oxide semiconductor (CMOS) device. The device includes a first device active region having a first width and a first gate arranged on the first device active region. A MOS transistor of a first conductivity type including a source/drain region of the first conductivity type is formed in the first device active region and a contact auxiliary pattern having a width greater than the first width and overlapping with the first device active region. The device also includes a second device active region having a second width greater than the first width and a second gate arranged on the second device active region. A MOS transistor of a second conductivity type including a source/drain region of the second conductivity type is formed in the second device active region.

In one embodiment, the contact auxiliary pattern is an epitaxial pattern, a buffer poly pattern, or a local interconnect.

In one embodiment, the first and second device active regions are formed within a substrate and defined by a trench isolation region filled with an insulating material having compressive stress, and the first and second conductivity types are P-type and N-type, respectively. In one embodiment, the insulating material having compressive stress is TEOS-$O_3$ based PECVD oxide, $SiH_4$ based PECVD oxide, high density plasma oxide, or SiON containing nitride with a molar fraction of less than 0.05. In one embodiment, the contact auxiliary pattern is an epitaxial pattern or a buffer poly pattern, and the P-type MOS transistor further comprises a contact that is formed on the epitaxial pattern or the buffer poly pattern and connects to the P-type source/drain region through the epitaxial pattern or the buffer poly pattern.

In one embodiment, the contact auxiliary pattern is a local interconnect, and the P-type MOS transistor further comprises a contact that is formed on the local interconnect and connects to the P-type source/drain region through the local interconnect.

In one embodiment, the N-type MOS transistor further comprises a contact that is formed on the second device active region and connects to the N-type source/drain region.

In one embodiment, the first and second device active regions are formed within a substrate and defined by a trench isolation region filled with an insulating material having tensile stress, and the first and second conductivity types are N-type and P-type, respectively. In one embodiment, the insulating material with tensile stress is TEOS-$O_3$ based CVD oxide or SiON containing nitride with a molar fraction of greater than 0.05. In one embodiment, the contact auxiliary pattern is an epitaxial pattern or a buffer poly pattern, and the N-type MOS transistor further comprises a contact that is formed on the epitaxial pattern or the buffer poly pattern and connects to the N-type source/drain region through the epitaxial pattern or the buffer poly pattern.

In one embodiment, the contact auxiliary pattern is a local interconnect, and the N-type MOS transistor further comprises a contact that is formed on the local interconnect and connects to the N-type source/drain region through the local interconnect.

In one embodiment, the P-type MOS transistor further comprises a contact that is formed on the second active region and connects to the P-type source/drain region.

In one embodiment, the same signal is applied to the first and second gates.

In accordance with another aspect, the invention is directed to a method of manufacturing a complementary metal oxide semiconductor (CMOS) device. According to the method, a first device active region and a second device active region are formed, the first device active region including at least one pair of transistor active regions wherein one transistor active region has a first width and the other transistor active region for forming a contact has a second width, and the second device active region having a third width greater than the first width MOS transistors of first and second conductivity types are formed on the first and second device active regions, respectively.

In one embodiment, the forming of the first and second device active regions comprises: forming a trench defining the first and second device active regions into a substrate; and filling the trench with a material having compressive stress. The first and second conductivity types are P-type and N-type, respectively.

In one embodiment, filling the trench with a material having compressive stress is performed by one of: (i) plasma enhanced chemical vapor deposition (PECVD) using TEOS gas and $O_3$ as reactive gases, (ii) PECVD using $SiH_4$ and $O_2$ as reactive gases, (iii) high density plasma (HDP) using $SiH_4$ and $O_2$ as reactive gases while using inert gas as a sputtering gas, and (iv) LPCVD using dichlorosilane (DCS), ammonia, and nitrate as reactive gases, by which the resultant material has a nitride with a molar fraction of less than 0.05.

In one embodiment, forming of the first and second device active regions comprises: forming a trench defining the first and second active regions into a substrate; and filling the trench with a material having tensile stress. The first and second conductivity types are N-type and P-type, respectively.

In one embodiment, filling the trench with a material having tensile stress is performed by CVD using TEOS gas and $O_3$ as reactive gases or LPCVD using dichlorosilane (DCS), ammonia, and nitrate as reactive gases, by which the resultant material has a nitride with a molar fraction of greater than 0.05, is used.

In accordance with another aspect, the invention is directed to a method of manufacturing a complementary metal oxide semiconductor (CMOS) device. According to the method, a first device active region having a first width and a second device active region having a second width greater than the first width are formed. First and second gates are formed on the first and second device active regions. A contact auxiliary pattern that has a width greater than the first width and overlaps with the first device active region exposed by the first gate is formed.

The method can further include, before or after the forming of the contact auxiliary pattern, forming source/drain regions of first and second conductivity types on the first and second device active regions, respectively.

In one embodiment, the contact auxiliary pattern is an epitaxial pattern, a buffer poly pattern, or a local interconnect.

In one embodiment, forming of the first and second device active regions comprises: forming a trench defining the first and second device active regions into a substrate; and filling the trench with a material having compressive stress. The first and second conductivity types are P-type and N-type, respectively.

In one embodiment, filling the trench with a material having compressive stress is performed by one of: (i) plasma enhanced chemical vapor deposition (PECVD) using TEOS gas and $O_3$ as reactive gases, (ii) PECVD using $SiH_4$ and $O_2$ as reactive gases, (iii) high density plasma (HDP) using $SiH_4$ and $O_2$ as reactive gases while using inactive gas as a sputtering gas, and (iv) low pressure CVD (LPCVD) using dichlorosilane (DCS), ammonia, and nitrate as reactive gases, by which the resultant material has a nitride with a molar fraction of less than 0.05.

In one embodiment, forming of the first and second device active regions comprises: forming a trench defining the first and second device active regions into a substrate; and filling the trench with a material having tensile stress. The first and second conductivity types are N-type and P-type, respectively. In one embodiment, filling the trench with a material having tensile stress is performed by CVD using TEOS gas and $O_3$ as reactive gases or LPCVD using dichlorosilane (DCS), ammonia, and nitrate as reactive gases, by which the resultant material has a nitride with a molar fraction of greater than 0.05.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity.

DETAILED DESCRIPTION OF THE INVENTION

Advantages and features of the present invention and methods of accomplishing the same may be understood more readily by reference to the following detailed description of preferred embodiments and the accompanying drawings. In the following detailed description, it should be noted that a "first conductivity type" and a "second conductivity type" refer to opposite conductivities such as N-type and P-type conductivities. Channel regions in N-type metal oxide semiconductor (NMOS) and P-type MOS (PMOS) transistors are subjected to a stress induced by a material of a gate insulating layer and a gate deposited on an active region, a stress induced depending on kinds of semiconductor materials forming a source/drain region, and/or a stress due to a shallow trench isolation (STD. In particular, the STI-induced stress may be compressive stress that degrades electron mobility or tensile stress that degrades hole mobility.

Embodiments of the present invention show complementary MOS devices having improved performance by achieving a balance between electron and hole mobilities. The balance can be achieved by an active region that can selectively cope with STI-induced stresses. CMOS device structures according to the embodiments of the present invention can also be adopted by semiconductor device to elastically and selectively react to stresses similar to the STI-induced stresses. The preferred embodiments of the present invention will be more fully understood by referencing FIGS. 1-21C.

Figure 1A:
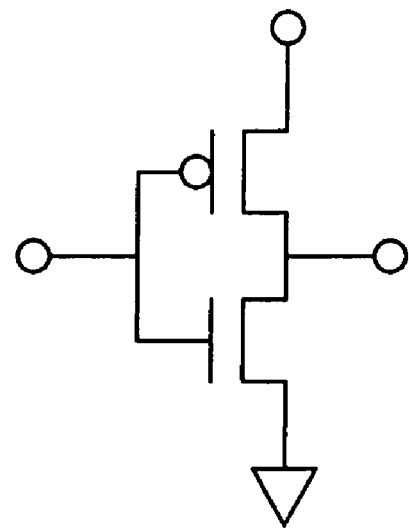
FIGS. 1A-1G are schematic diagrams illustrating circuits using complementary metal oxide semiconductor (CMOS) devices according to the present invention.
Figure 1B:
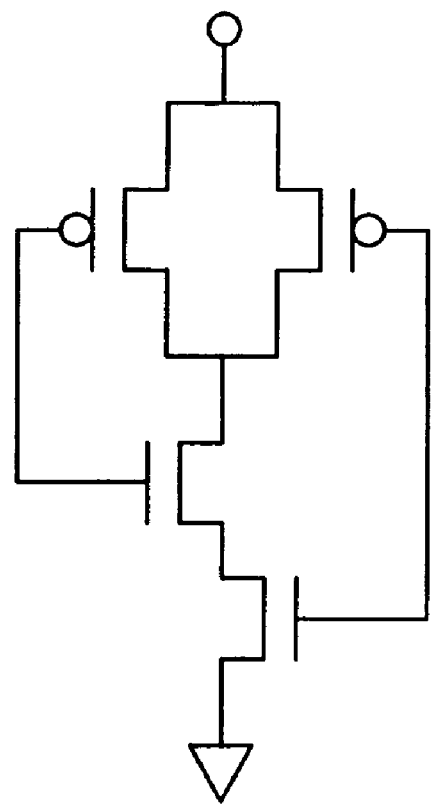
Figure 1C:
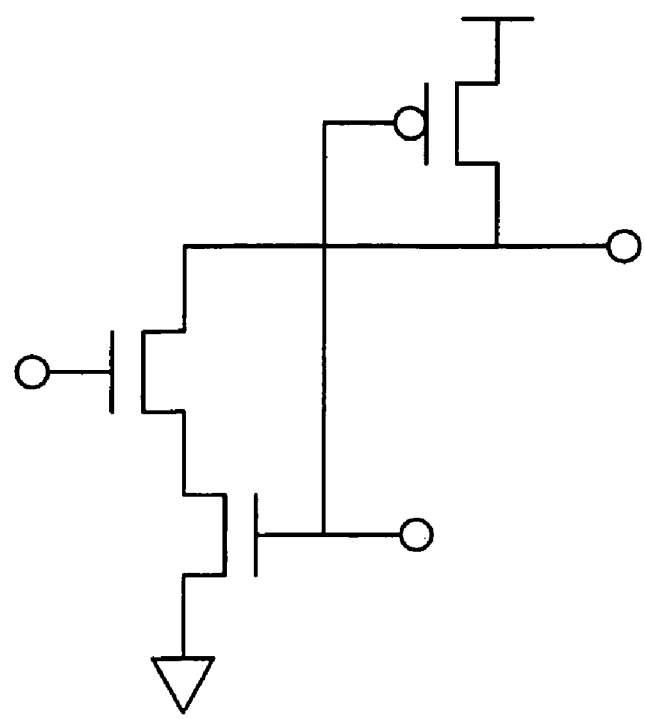
Figure 1D:
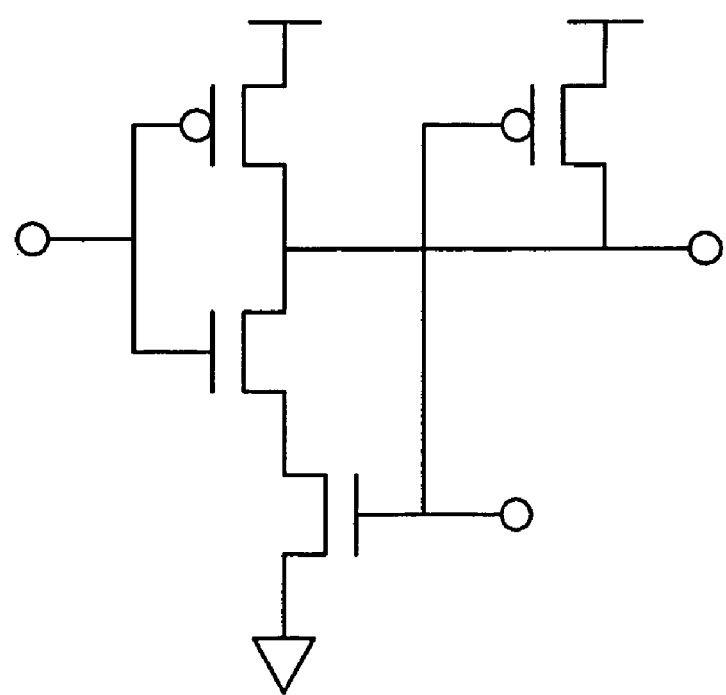
Figure 1E:
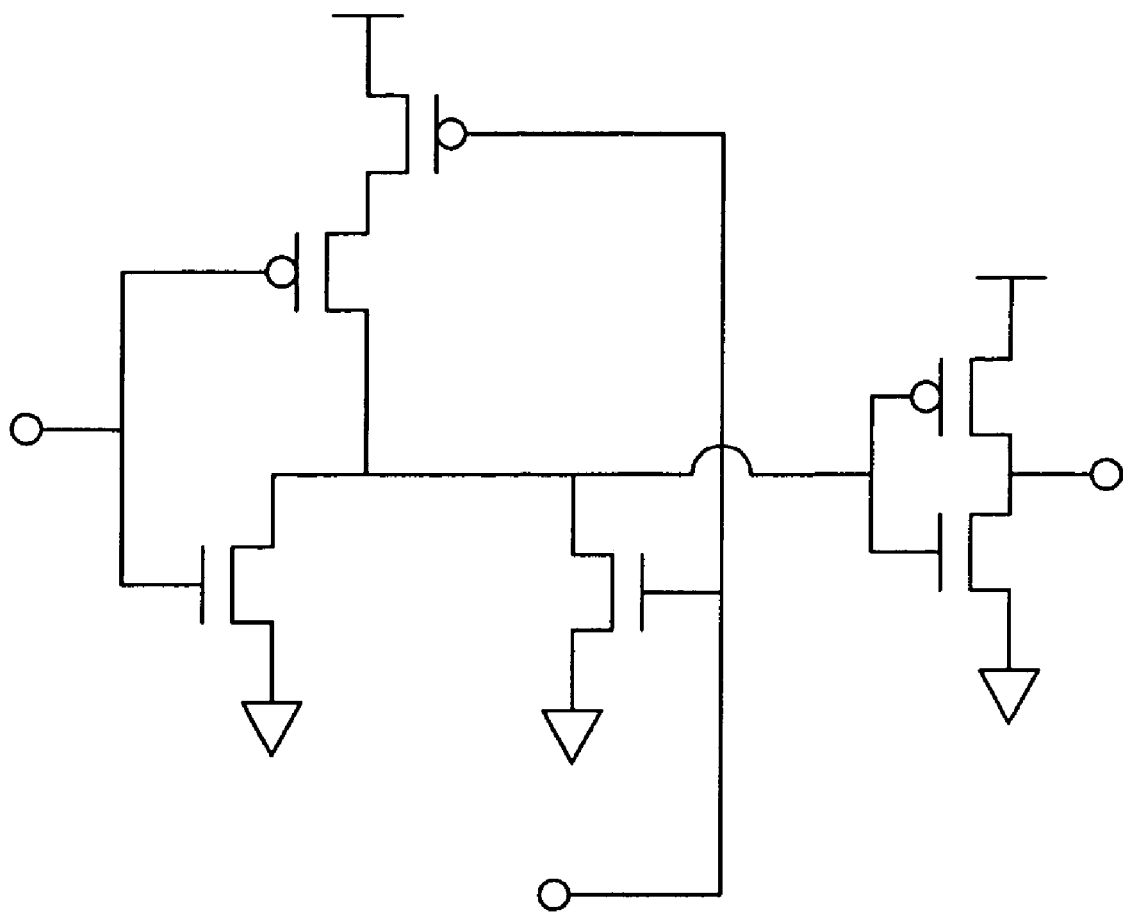
Figure 1F:
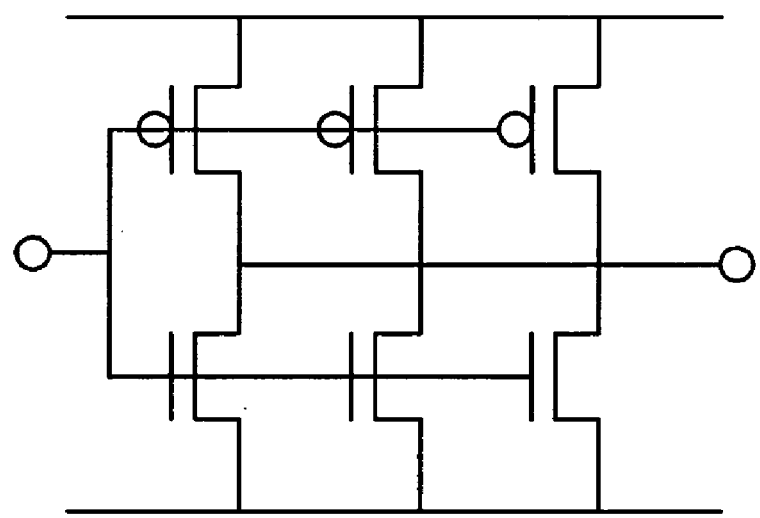
Figure 1G:
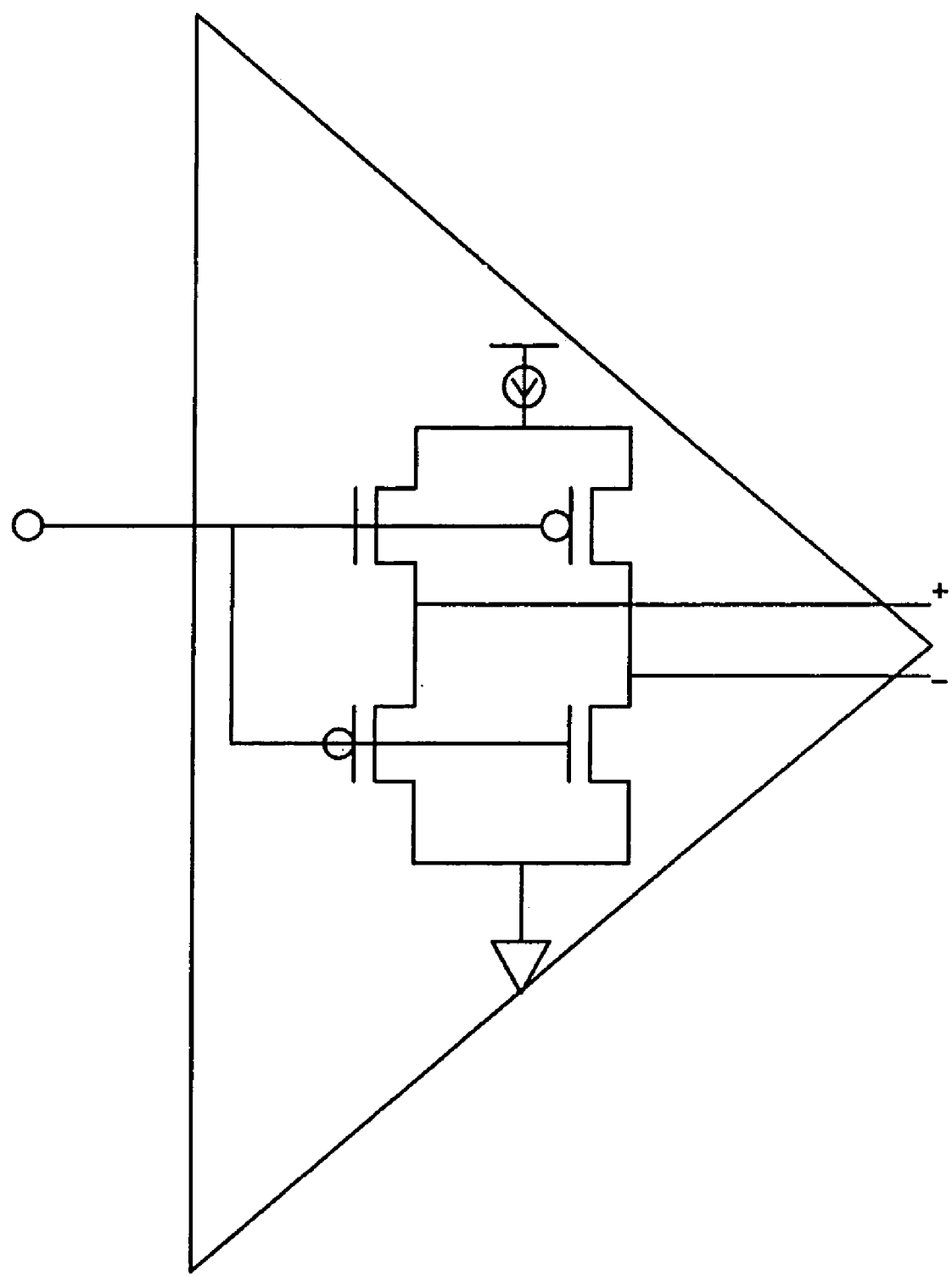

The CMOS devices according to the embodiments of the present invention can be used in digital signal processing and/or data storage applications. For example, a CMOS device may be combined with a logic circuit and a high frequency bipolar transistor to implement a bipolar CMOS (BiCMOS) circuit and a full-CMOS static random access memory (SRAM) cell. FIG. 1A is a circuit diagram of a CMOS inverter, FIG. 1B is a circuit diagram of a CMOS NAND gate, FIG. 1C is a circuit diagram of a CMOS pull-up circuit, FIG. 1D is a circuit diagram of a CMOS pull-down circuit, FIG. 1E is a circuit diagram of a CMOS buffer, and FIGS. 1F and 1G are circuit diagrams of CMOS output drivers. It will be readily apparent to those skilled in the art that the CMOS devices according to the embodiments of the present invention can also be applied to various other circuits. In a narrow sense, a CMOS device refers to a device containing NMOS and PMOS transistors with the same signal applied to a common gate as shown in FIGS. 1A-1G. In a broad sense, a CMOS device refers to a device containing independent NMOS and PMOS transistors on the same substrate driven by independent gates. The embodiments of the present invention that will be described below can be applied to CMOS devices in a broad sense.

Figure 2:
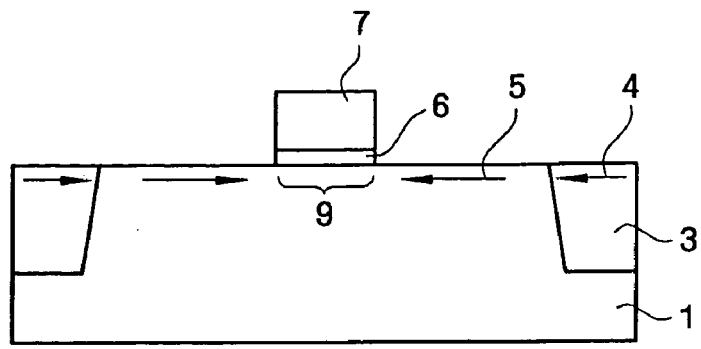
FIG. 2 is a cross-sectional view showing compressive stress induced by a shallow trench isolation (STI).

FIGS. 2-11B show CMOS devices according to first through third embodiments of the present invention where channel regions are subjected to STI-induced compressive stresses that may lower electron mobilities. Referring to FIG. 2, when forming a STI 3 by filling a trench with a filling material having compressive stress or a liner (not shown) with compressive stress along an inner sidewall of the STI 3, followed by annealing the STI 3, the material having compressive stress or the liner expands in a direction indicated by an arrow 4 so that a substrate 1 forming an active region defined by the STI 3 is also subjected to compressive stress 5. As a result, atoms in a substrate lattice structure in a channel region 9 pack closer together, obstructing the movement of electrons while permitting the free movement of holes.

In the first through third embodiments, the width of the entire or a portion of an active region in a PMOS transistor is made less than that of an active region in an NMOS transistor so that the STI can be located close to a PMOS channel region and far away from an NMOS channel region. Thus, a balance between electron and hole mobilities can be achieved by differentiating the effect of compressive stress on the PMOS channel region from the effect of the compressive stress on the NMOS channel region, thus providing a CMOS device with improved performance.

Figure 3:
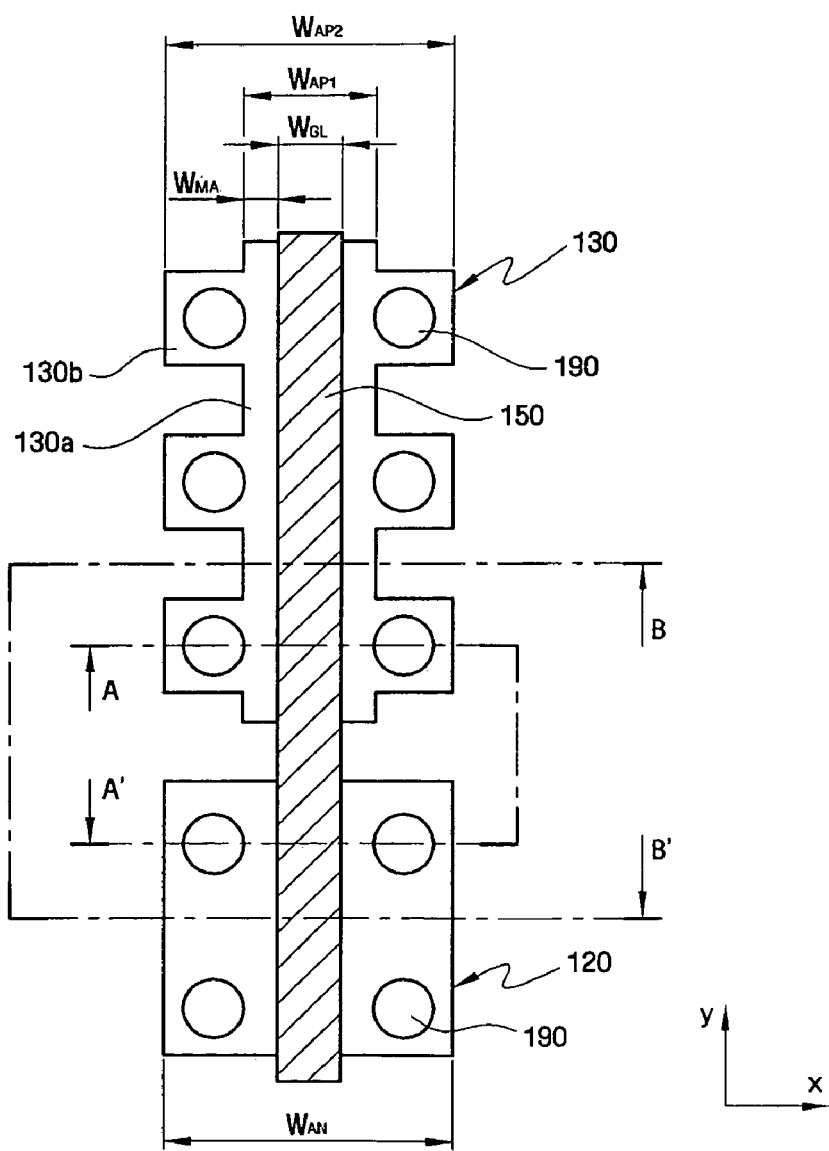
FIG. 3 is a layout view of a CMOS device according to a first embodiment of the present invention.
Figure 4A:
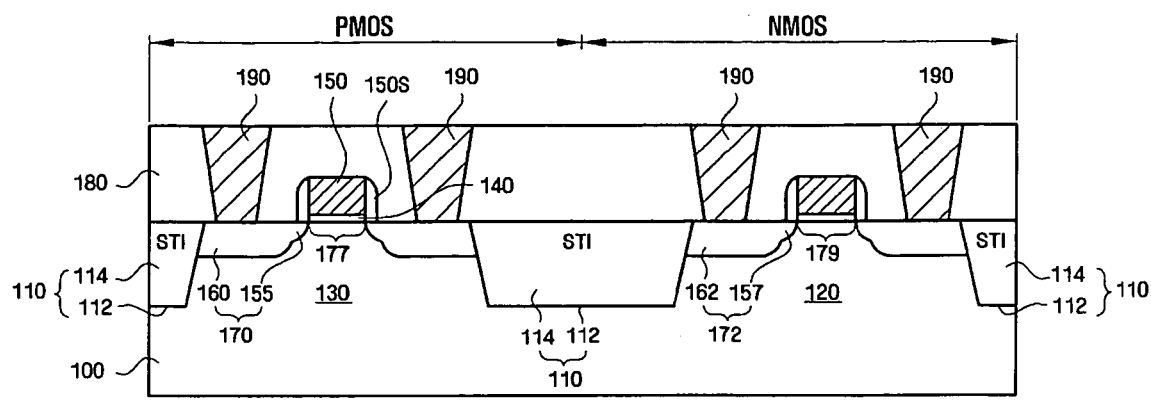
FIGS. 4A and 4B are cross-sectional views of the CMOS device of FIG. 3 taken along lines A-A' and B-B', respectively, of FIG. 3.
Figure 4B:
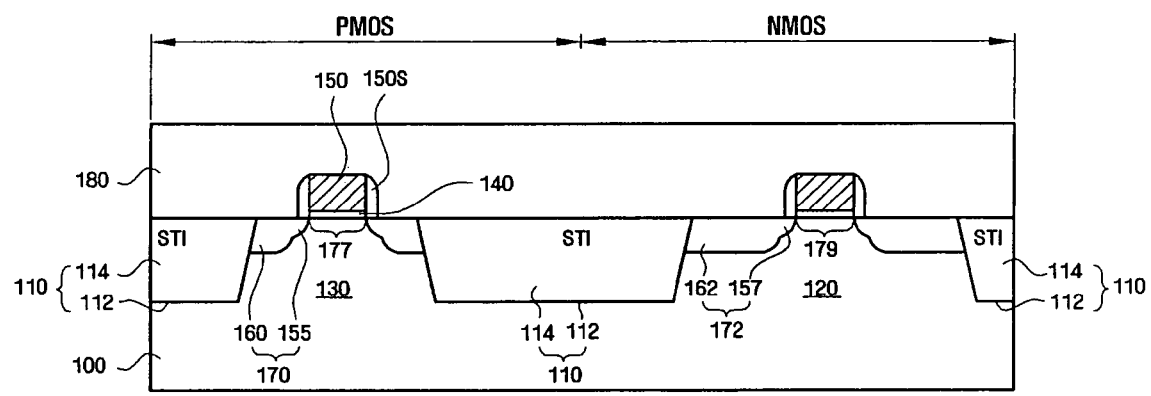

FIG. 3 is a layout view of a CMOS device according to a first embodiment of the present invention, and FIGS. 4A and 4B are cross-sectional views of the CMOS device of FIG. 3 taken along lines A-A' and B-B', respectively, of FIG. 3.

Referring to FIGS. 3-4B, an NMOS active region 120 and a PMOS active region 130 are defined by a STI 110 formed into a substrate 100.

Figure 5:
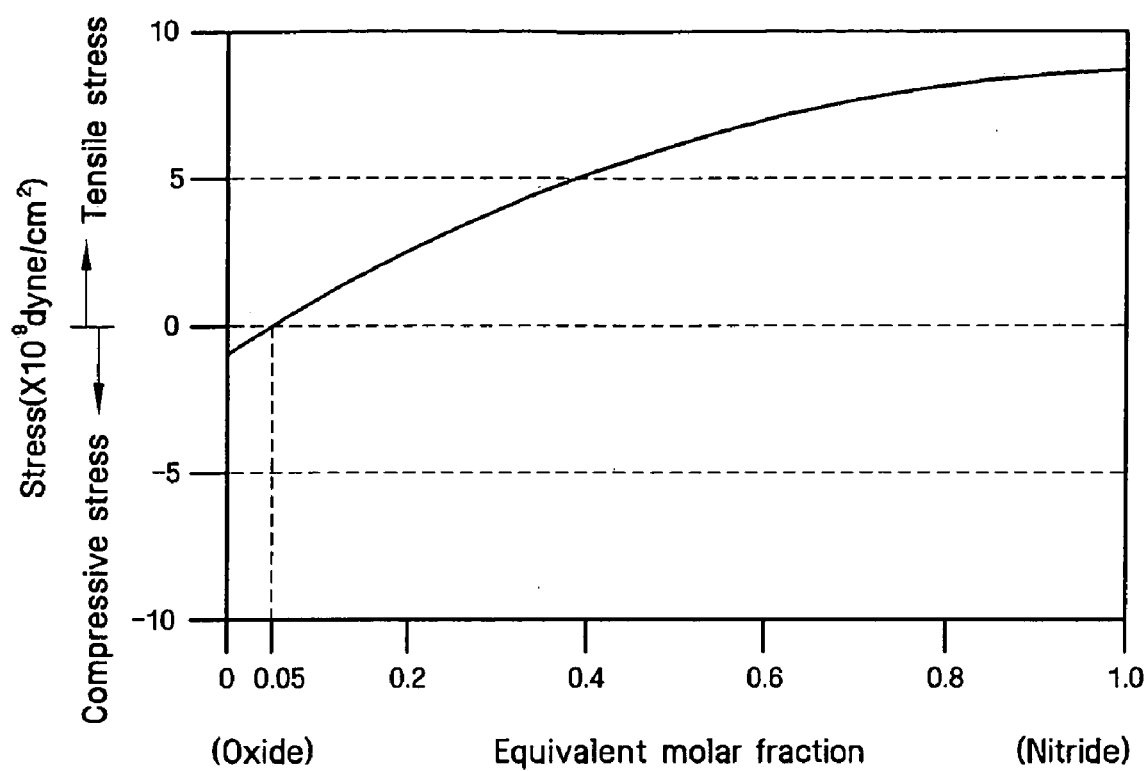
FIG. 5 is a graph showing stresses with respect to a molar fraction of nitride in SiON.

The STI 110 is formed by filling a trench region 112 formed in the substrate 100 to a predetermined depth with an insulating material 114. The insulating material 114 can apply compressive stress to the substrate 100 in the x-axis direction, e.g., the direction of a channel. For example, the insulating material 114 may be tetraethyl orthosilicate (TEOS)-ozone ($O_3$) based plasma enhanced chemical vapor deposition (PECVD) oxide, $SiH_4$ based PECVD oxide, high density plasma oxide, or SiON containing nitride with a molar fraction of less than 0.05 as shown in FIG. 5.

Referring back to FIGS. 3 through 4B, the PMOS active region 130 includes at least one pair of active regions 130a and 130b. The active region 130a has a first width $W_{AP1}$ and the active region 130b for forming a source/drain contact 190 has a second width $W_{AP2}$. The NMOS active region 120 has a third width $W_{AN}$ greater than the first width $W_{AP1}$. The second width $W_{AP2}$ may be substantially equal to the third width $W_{AN}$.

Figure 6:
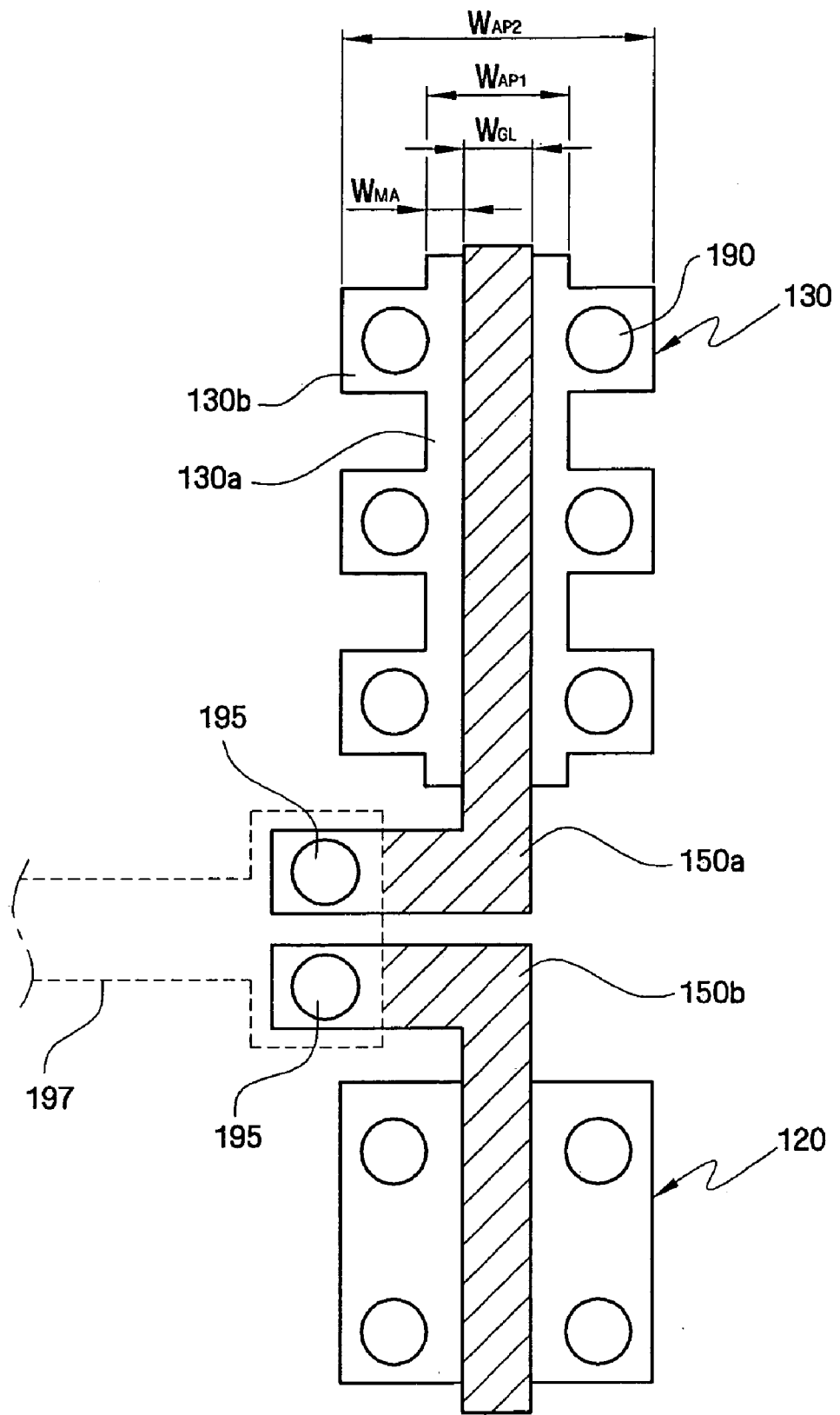
FIG. 6 is a layout view showing a modified embodiment of the CMOS device of FIG. 3.

Referring to FIG. 3, NMOS and PMOS active regions 120 and 130 share a common gate 150 overlying the gate insulating layer 140 so that the same signal is applied to NMOS and PMOS transistors. Alternatively, as shown in FIG. 6, independent gate patterns 150a and 150b may be respectively arranged on the NMOS active region 120 and the PMOS active region 130 and connected to a single gate wiring 197 through corresponding gate contacts 195, so that the same signal is applied to the NMOS and PMOS transistors.

The PMOS transistor includes the gate 150 and a source/drain region 170 formed within the PMOS active region 130. The source/drain region 170 includes an extended source/drain region 155 aligned with the gate 150 and a deep source/drain region 160 aligned with the gate 150 and a gate sidewall spacer 150S.

The NMOS transistor includes the gate 150 and a source/drain region 172 formed within the NMOS active region 120. The source/drain region 172 includes an extended source/drain region 157 aligned with the gate 150 and a deep source/drain region 162 aligned with the gate 150 and the gate sidewall spacer 150S.

The source/drain contact 190 is formed in an interlevel dielectric layer 180.

While a PMOS channel 177 is located close to the STI 110 applying a compressive stress in the x-axis direction, e.g., a channel direction, an NMOS channel 179 is located far from the STI 110. Thus, it is possible to improve the performance of both the PMOS and NMOS transistors.

Figure 7:
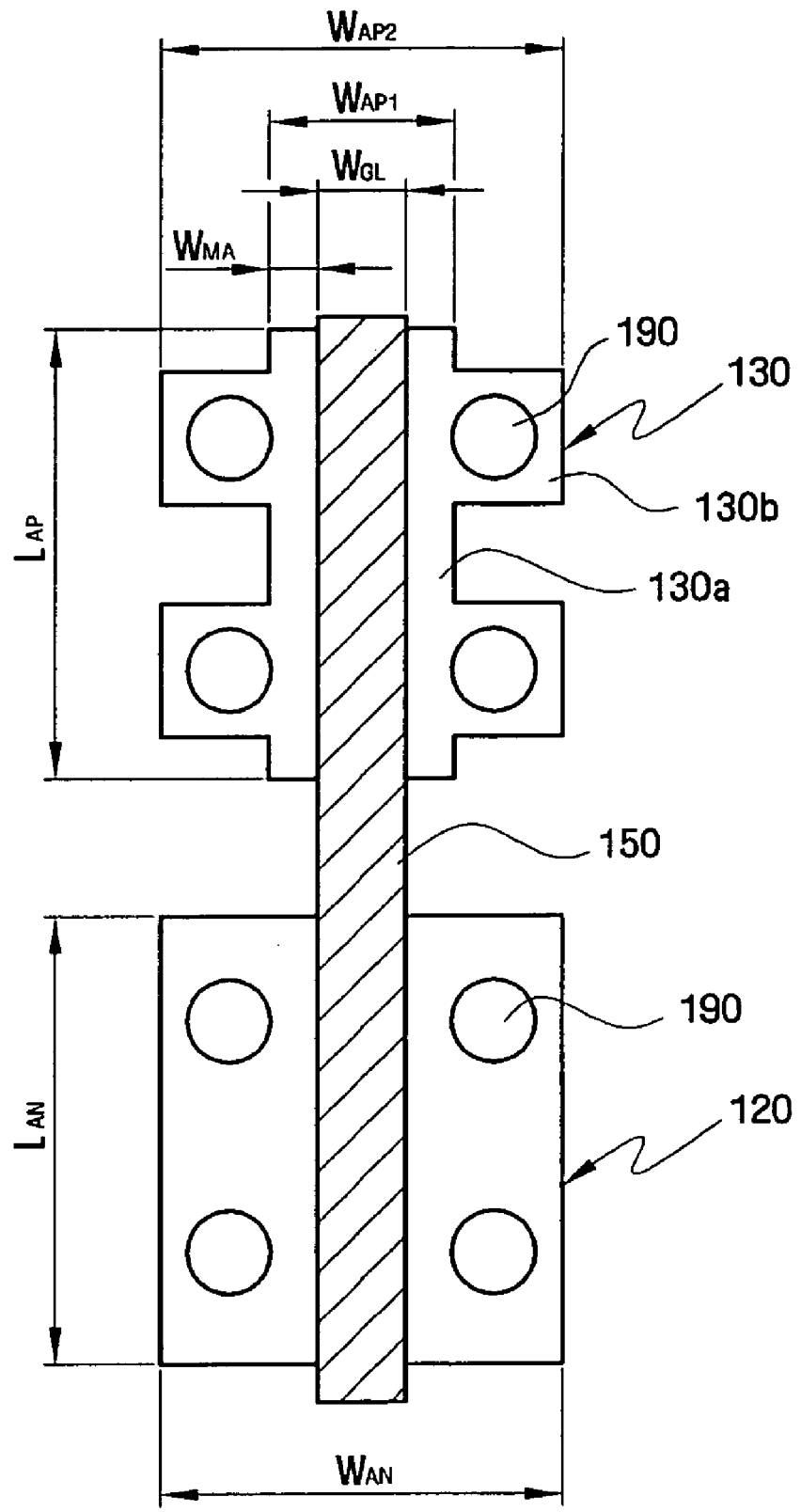
FIG. 7 is a layout view showing another modified embodiment of the CMOS device of FIG. 3.

Furthermore, as shown in FIG. 7, when compressive stress acting upon the PMOS channel 177 increases hole mobility so as to compensate a difference between electron and hole mobilities, the area of the CMOS device can be effectively reduced by making a length LAN of the NMOS active region 120 that determines a channel width of the NMOS transistor equal to a length LAP of the PMOS active region 130 that determines a channel width of the PMOS transistor.

Figure 8:
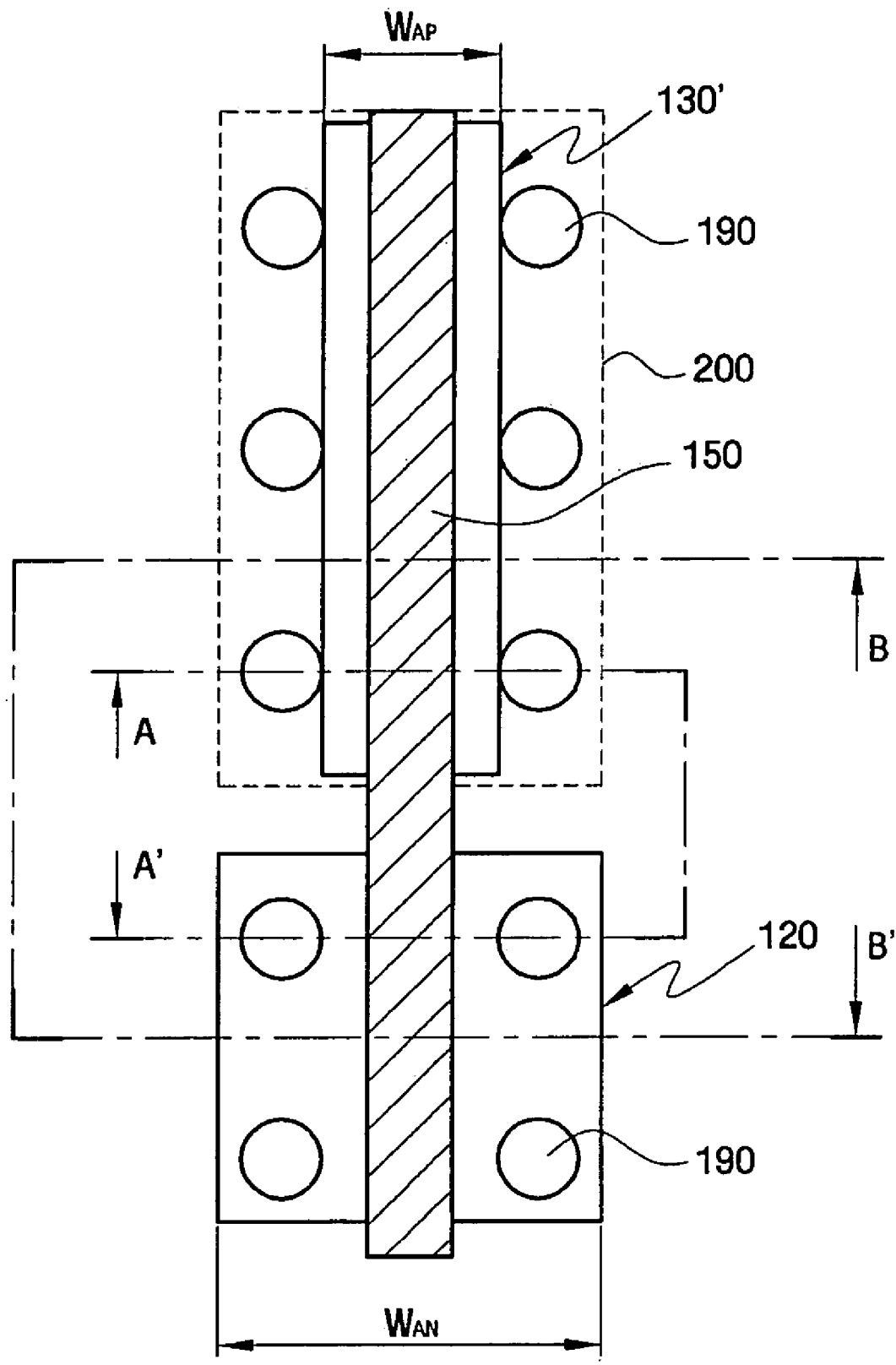
FIG. 8 is a layout view of a CMOS device according to a second embodiment of the present invention.
Figure 9A:
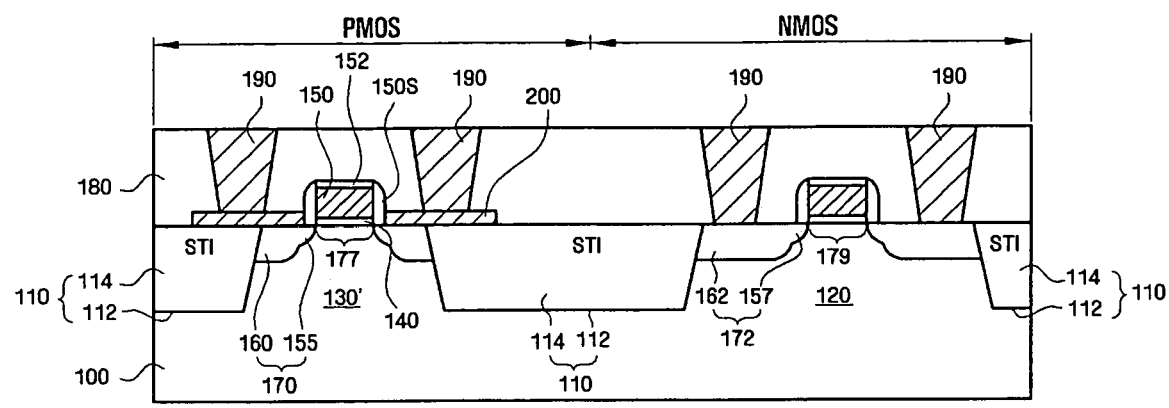
FIGS. 9A and 9B are cross-sectional views of the CMOS device of FIG. 8 taken along lines A-A' and B-B', respectively, of FIG. 8.
Figure 9B:
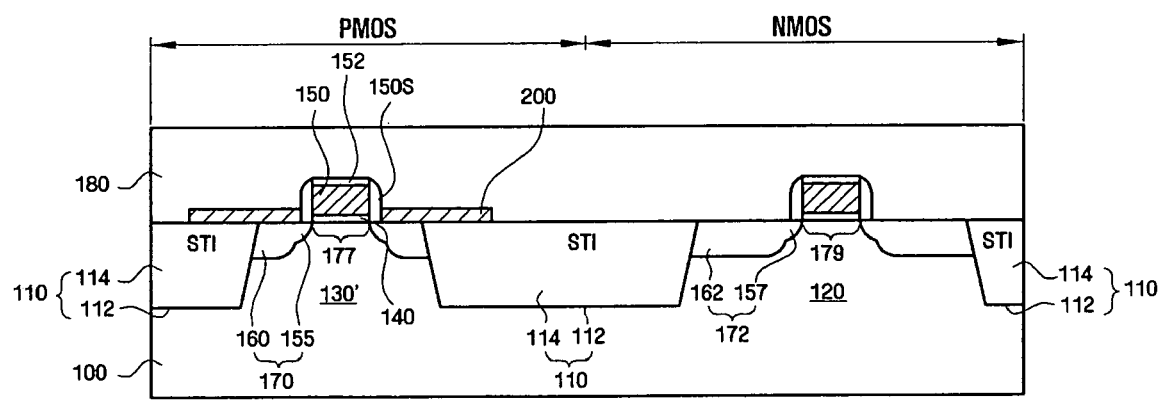

FIG. 8 is a layout view of a CMOS device according to a second embodiment of the present invention, and FIGS. 9A and 9B are cross-sectional views of the CMOS device of FIG. 8 taken along lines A-A' and B-B', respectively, of FIG. 8.

Referring to FIGS. 8-9B, an NMOS active region 120 and a PMOS active region 130' are defined by a STI 110 formed into a substrate 100. The STI 110 is formed from a material having compressive stress as described in the first embodiment.

Since a width $W_{AP}$ of the PMOS active region 130' is less than a width $W_{AN}$ of the NMOS active region 120 throughout the entire length of the PMOS active region 130', the width $W_{AP}$ is not sufficiently great to form a source/drain contact 190 of a PMOS transistor. Thus, the CMOS device further includes a contact auxiliary pattern 200 that is formed on the PMOS active region 130' and extends to an adjacent STI 110. The contact auxiliary pattern 200 may be an epitaxial pattern or a buffer poly pattern. While FIGS. 8-9B show that the contact auxiliary pattern 200 is formed only on the PMOS active region 130', it may be formed on the NMOS active region 120 as well.

The PMOS transistor includes a gate 150 and a source/drain region 170. The source/drain region 170 includes an extended source/drain region 155 that is formed in the PMOS active region 130' and aligned with the gate 150 and an elevated deep source/drain region 160 that is formed in the PMOS active region 130' and the contact auxiliary pattern 200 and aligned with the gate 150 and a gate sidewall spacer 150S. If necessary, before forming the contact auxiliary pattern 200, the deep source/drain region 160 may be formed only within the PMOS active region 130'.

The NMOS transistor includes the gate 150 and a source/drain region 172 formed within the NMOS active region 120. The source/drain region 172 includes an extended source/drain region 157 aligned with the gate 150 and a deep source/drain region 162 aligned with the gate 150 and the gate sidewall spacer 150S.

The CMOS device may further include a capping insulating layer 152 that is formed on the gate 150 and protects the top surface of the gate 150 when forming the contact auxiliary pattern 200. The source/drain contact 190 of the PMOS transistor is formed in an interlevel dielectric layer 180 overlying the contact auxiliary pattern 200 and connected to the source/drain region 170 through the contact auxiliary pattern 200. In contrast, the source/drain contact 190 of the NMOS transistor is formed in the interlevel dielectric layer 180 overlying the NMOS active region 120 and connected to the source/drain region 172.

Figure 10:
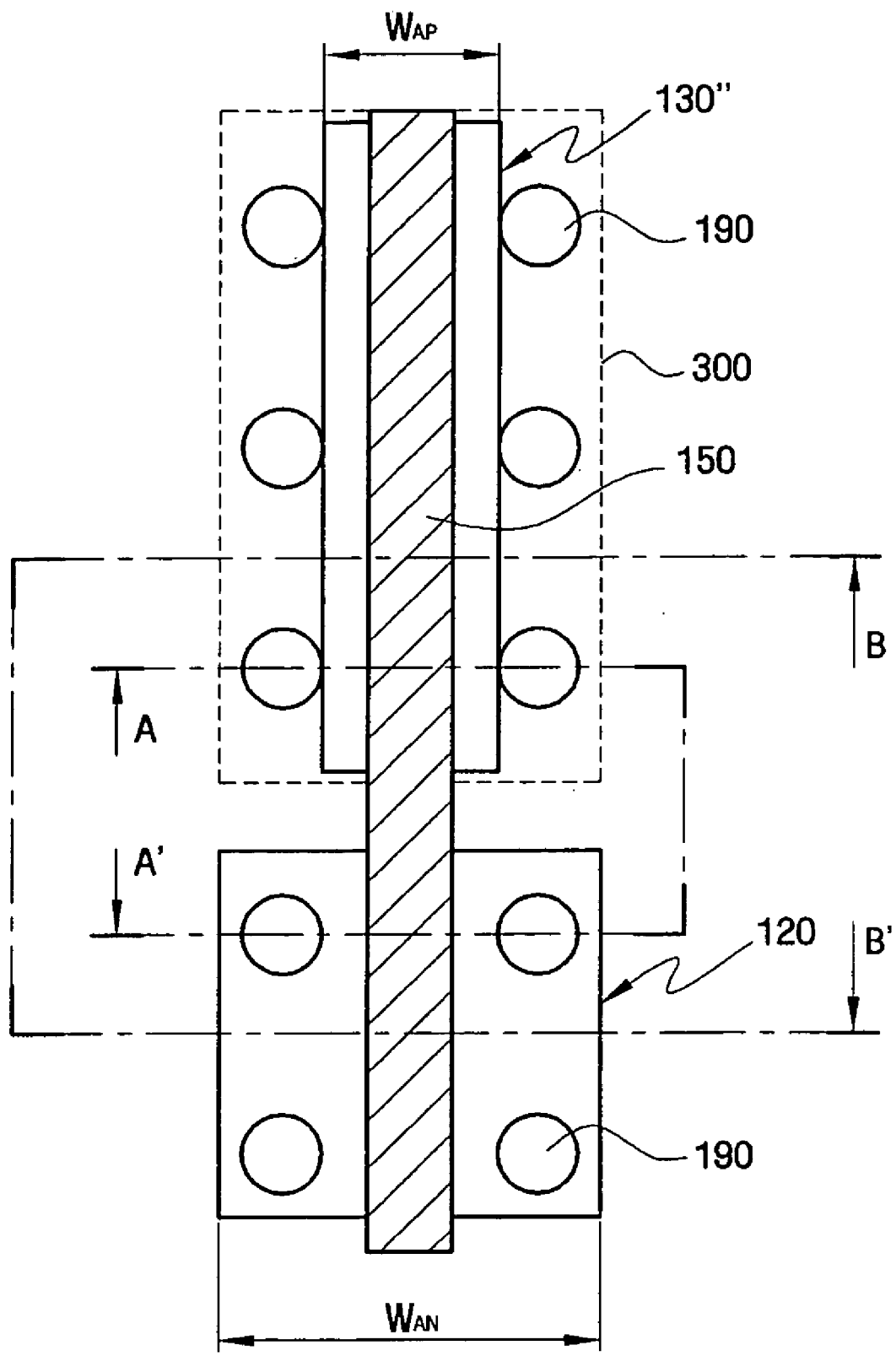
FIG. 10 is a layout view of a CMOS device according to a third embodiment of the present invention.
Figure 11A:
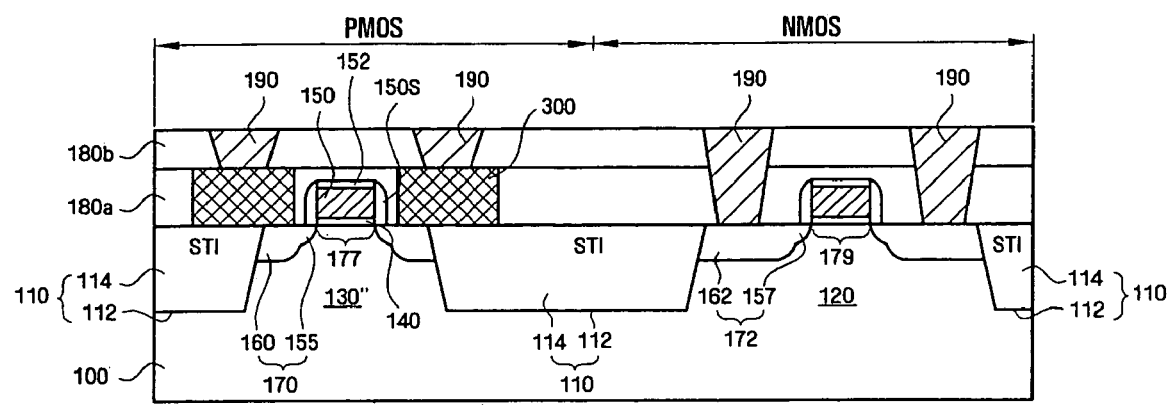
FIGS. 11A and 11B are cross-sectional views of the CMOS device of FIG. 10 taken along lines A-A' and B-B', respectively, of FIG. 10.
Figure 11B:
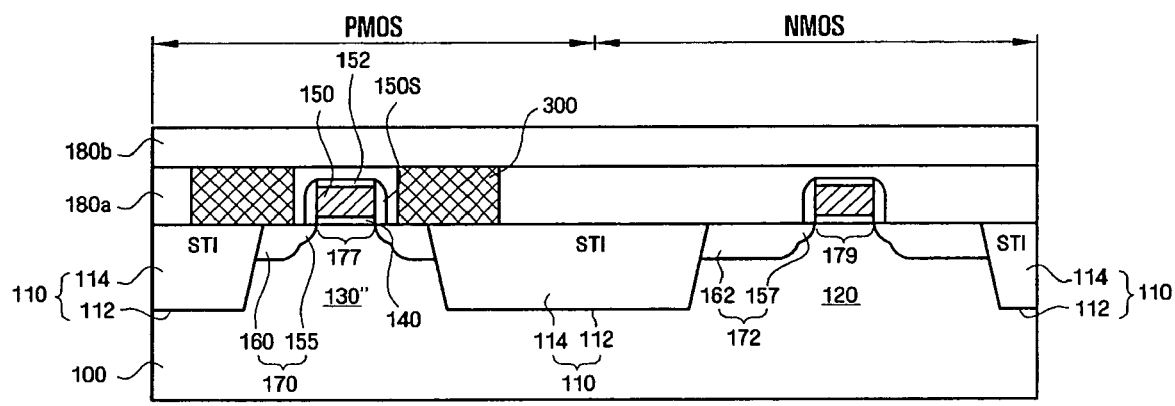

FIG. 10 is a layout view of a CMOS device according to a third embodiment of the present invention, and FIGS. 11A and 11B are cross-sectional views of the CMOS device of FIG. 10 taken along lines A-A' and B-B', respectively.

Referring to FIGS. 10-11B, an NMOS active region 120 and a PMOS active region 130" are defined by a STI 110 formed into a substrate 100. The STI 110 is formed from a material having compressive stress as described in the first embodiment.

As in the second embodiment, since a width $W_{AP}$ of the PMOS active region 130" is less than a width $W_{AN}$ of the NMOS active region 120 throughout the entire length of the PMOS active region 130", the width $W_{AP}$ is not sufficiently great to form a source/drain contact 190 of a PMOS transistor. Thus, the CMOS device further includes a contact auxiliary pattern 300 that is formed on the PMOS active region 130" and extends to an adjacent STI 110. The contact auxiliary pattern 300 may be a damascene local interconnect formed in a first interlevel dielectric layer 180a. The damascene local interconnect may be made from at least one of aluminum (Al), Al-alloy, copper (Cu), gold (Au), silver (Ag), tungsten (W), and molybdenum (Mo). In particular, a Cu damascene local interconnect may be effective for low resistance. While FIGS. 10-11B show that the contact auxiliary pattern 300 is formed only on the PMOS active region 130", it may be formed on the NMOS active region 120 as well.

The PMOS transistor includes a gate 150 and a source/drain region 170 formed in the PMOS active region 130". The source/drain region 170 includes an extended source/drain region 155 aligned with the gate 150 and a deep source/drain region 160 that is aligned with the gate 150 and a gate sidewall spacer 150S and connects with the contact auxiliary pattern 300.

The NMOS transistor includes the gate 150 and a source/drain region 172 formed within the NMOS active region 120. The source/drain region 172 includes an extended source/drain region 157 aligned with the gate 150 and a deep source/drain region 162 aligned with the gate 150 and the gate sidewall spacer 150S.

The CMOS device may further include a capping insulating layer 152 that is formed on the gate 150 and protects the top surface of the gate 150 when forming a buffer poly pattern or an insulating material for the contact auxiliary pattern 300. The source/drain contact 190 of the PMOS transistor is formed in a second interlevel dielectric layer 180b overlying the contact auxiliary pattern 300 that is a local interconnect and is connected to the source/drain region 170 through the contact auxiliary pattern 300. In contrast, the source/drain contact 190 of the NMOS transistor is formed in the first and second interlevel dielectric layers 180a and 180b overlying the NMOS active region 120 and connected to the source/drain region 172.

FIGS. 12-18B show CMOS devices according to fourth through sixth embodiments of the present invention where channel regions are subjected to STI-induced tensile stress that improves electron mobility.

Figure 12:
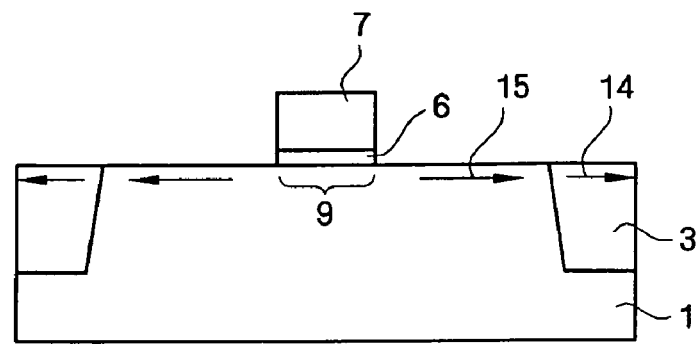
FIG. 12 is a cross-sectional view showing a tensile stress induced by STI.

Referring to FIG. 12, after forming a STI 3 by filling a trench with a material having tensile stress or annealing the STI 3 thus formed, the material having tensile stress shrinks in a direction indicated by an arrow 14 so that a substrate 1 forming an active region defined by the STI 3 is also subjected to tensile stress 15. As a result, atoms in a substrate lattice structure in a channel region 9 are forced farther apart, hindering the movement of holes while permitting the free movement of electrons.

In the fourth through sixth embodiments, the width of an active region in an NMOS transistor is made less than that of an active region in a PMOS transistor so that the STI 3 can be located close to an NMOS channel region and far away from a PMOS channel region. Thus, a balance between electron and hole mobilities can be achieved by differentiating the effect of tensile stress on the NMOS channel region from the effect of the tensile stress on the PMOS channel region, thus providing a CMOS device with improved performance. Since a STI is formed of a different material in the fourth through sixth embodiments from that of STI in the first through third embodiments, NMOS and PMOS transistor structures in the fourth through sixth embodiments correspond to the switched structures of the NMOS and PMOS transistors structures in the previously described embodiments, respectively.

Figure 13:
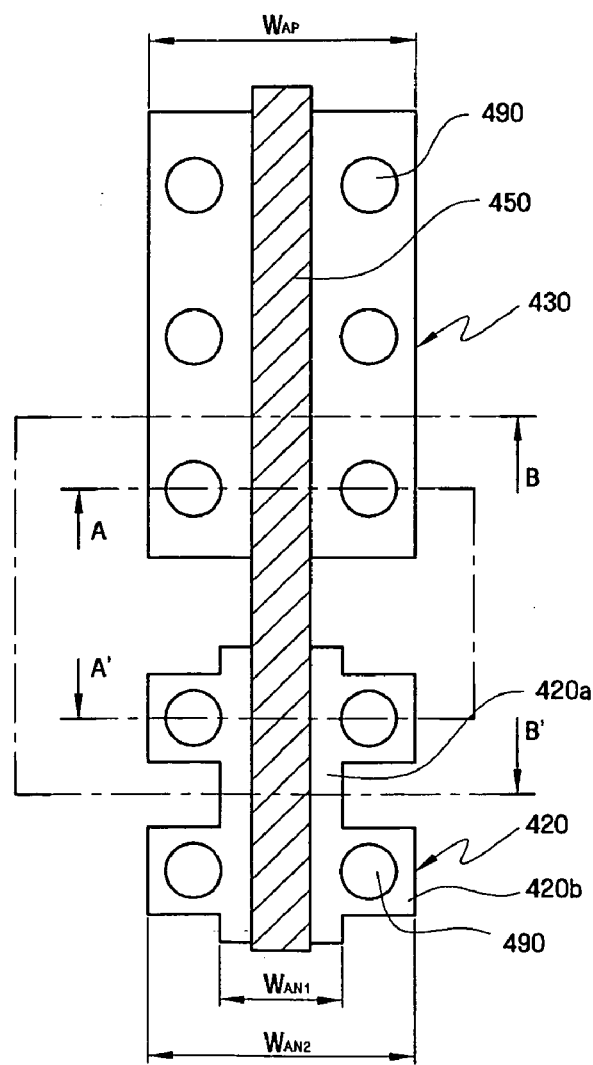
FIG. 13 is a layout view of a CMOS device according to a fourth embodiment of the present invention.
Figure 14A:
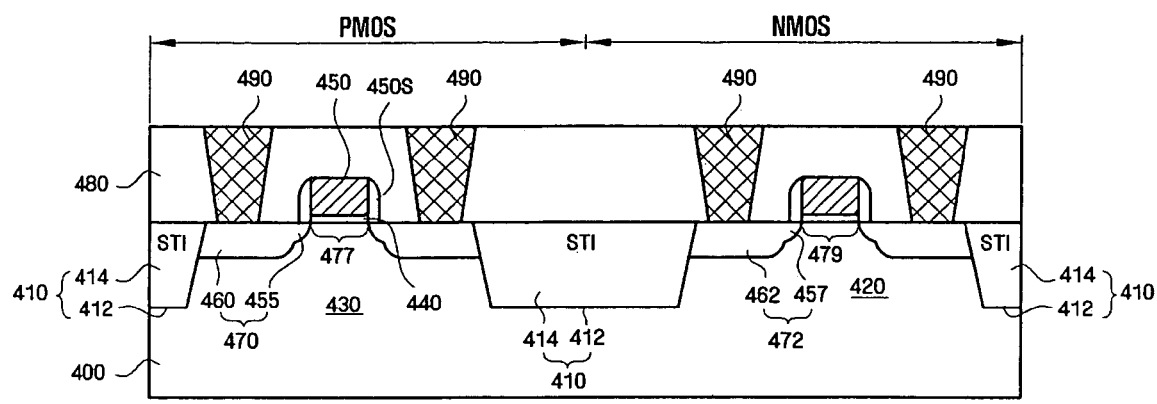
FIGS. 14A and 14B are cross-sectional views of the CMOS device of FIG. 13 taken along lines A-A' and B-B', respectively, of FIG. 13.
Figure 14B:
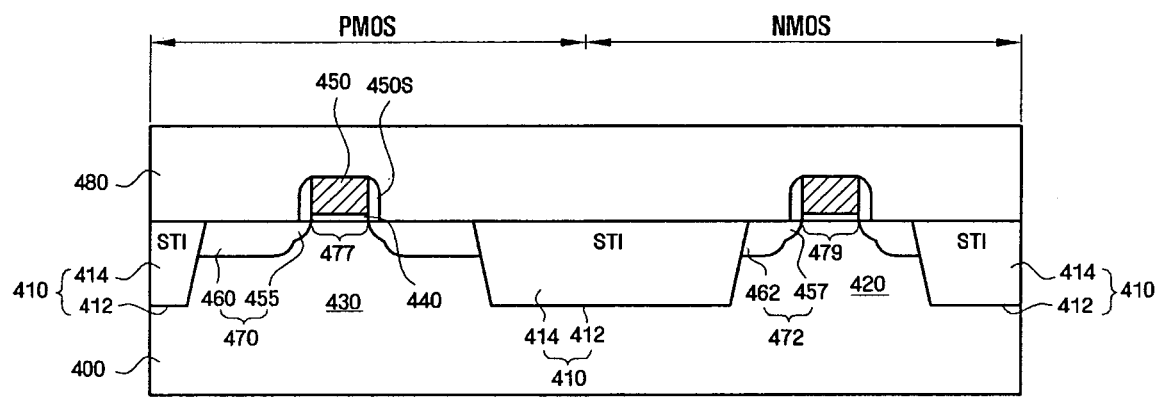

FIG. 13 is a layout view of a CMOS device according to a fourth embodiment of the present invention, and FIGS. 14A and 14B are cross-sectional views of the CMOS device of FIG. 13 taken along lines A-A' and B-B', respectively, of FIG. 13.

Referring to FIGS. 13-14B, an NMOS active region 420 and a PMOS active region 430 are defined by a STI 410 formed into a substrate 400. The STI 410 includes a trench 412 formed in the substrate 400 to a predetermined depth and an insulating material 414 filling the trench 412. The insulating material 414 can apply tensile stress to the substrate 400 in the x-axis direction, e.g., the direction of a channel. For example, the insulating material 414 may be TEOS-O₃ based CVD oxide or SiON containing nitride with a molar fraction of greater than 0.05 as shown in FIG. 5.

The NMOS active region 420 includes at least one pair of active regions 420a and 420b. The active region 420a has a first width $W_{AN1}$ and the active region 420b for forming a source/drain contact 490 has a second width $W_{AN2}$. The PMOS active region 430 has a third width $W_{AP}$ greater than the first width $W_{AN1}$. The second width $W_{AN2}$ may be substantially equal to the third width $W_{AP}$.

The NMOS and PMOS active regions 420 and 430 share a common gate 450 with the gate insulating layer 440 interposed therebetween. Alternatively, independent gate patterns may be respectively arranged on the NMOS active region 420 and the PMOS active region 430 and connected to a single gate wiring through corresponding gate contacts. (refer to FIG. 6)

The PMOS transistor includes the gate 450 and a source/drain region 470 formed within the PMOS active region 430. The source/drain region 470 includes an extended source/drain region 455 aligned with the gate 450 and a deep source/drain region 460 aligned with the gate 450 and a gate sidewall spacer 450S.

The NMOS transistor includes the gate 450 and a source/drain region 472 formed within the NMOS active region 420. The source/drain region 472 includes an extended source/drain region 457 aligned with the gate 450 and a deep source/drain region 462 aligned with the gate 450 and the gate sidewall spacer 450S. The source/drain contact 490 is formed in an interlevel dielectric layer 480. While a NMOS channel 479 is located close to the STI 410 applying tensile stress in the x-axis direction, e.g., a channel direction, a PMOS channel 477 is located far from the STI 410. Thus, it is possible to improve the performance of both the PMOS and NMOS transistors.

Figure 15:
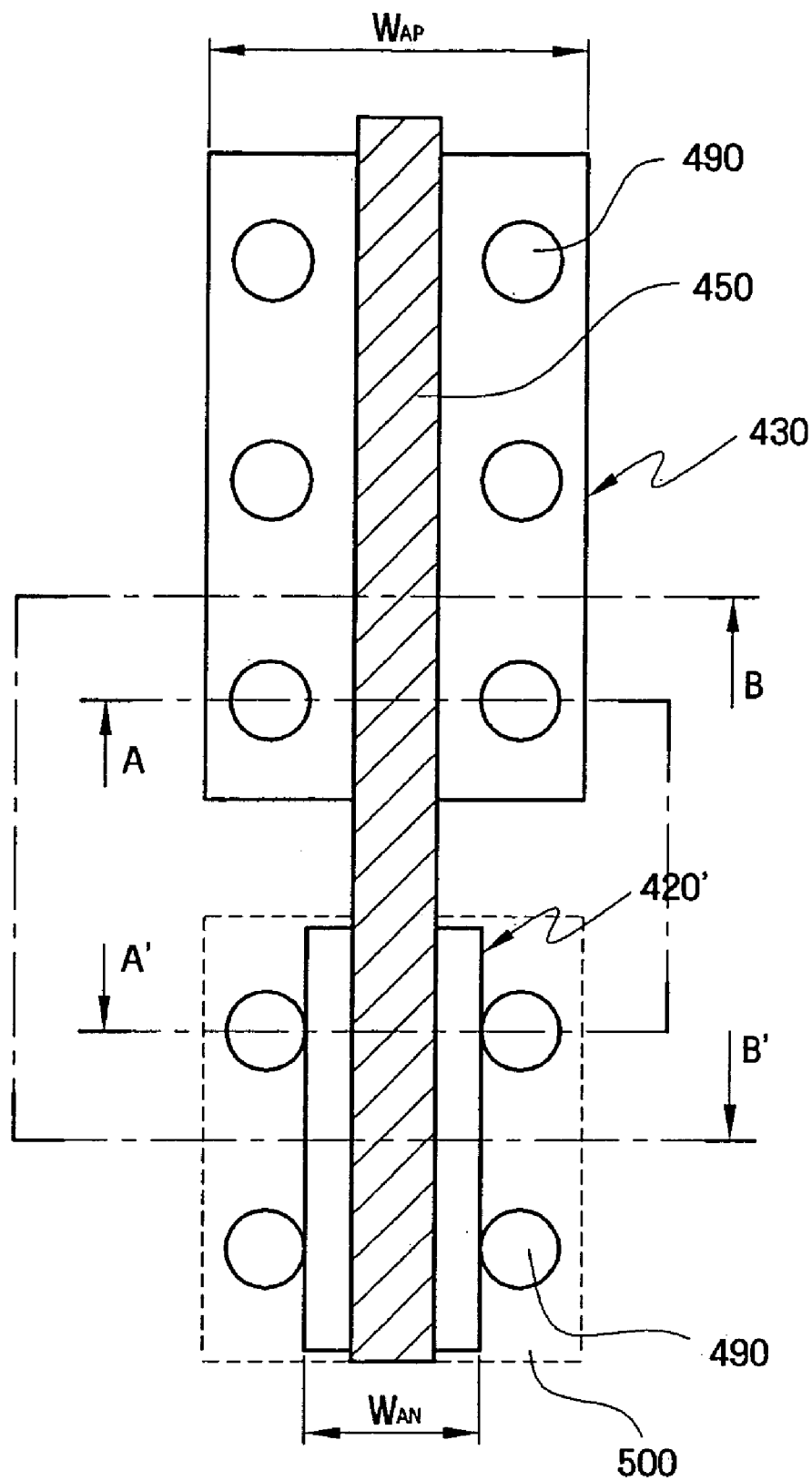
FIG. 15 is a layout view of a CMOS device according to a fifth embodiment of the present invention.
Figure 16A:
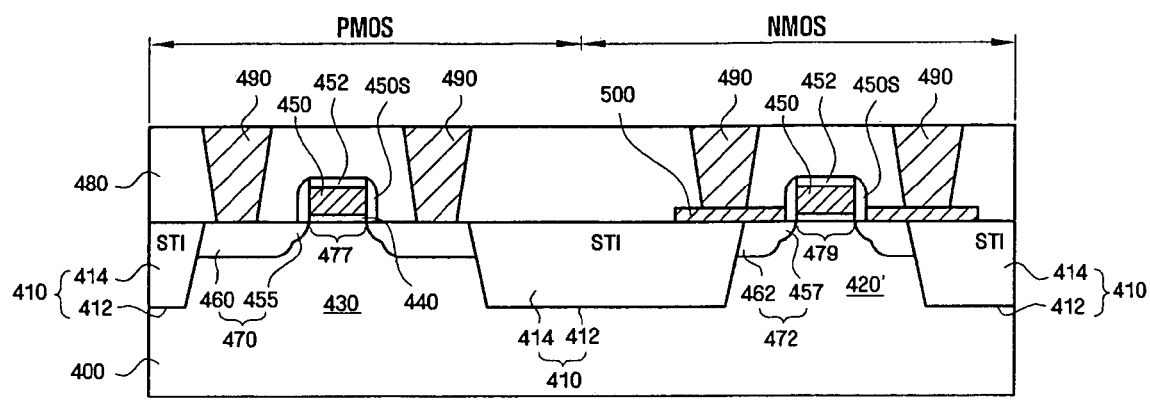
FIGS. 16A and 16B are cross-sectional views showing the CMOS device of FIG. 15 taken along lines A-A' and B-B', respectively, of FIG. 15.
Figure 16B:
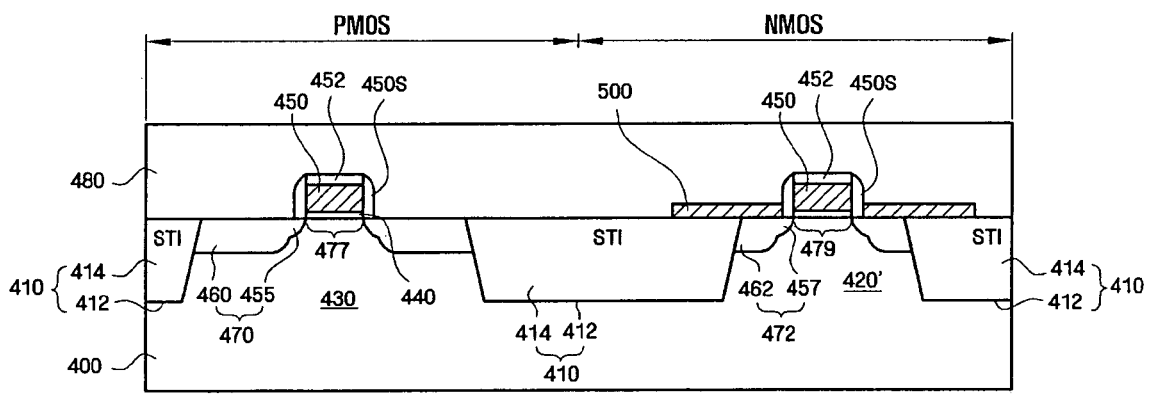

FIG. 15 is a layout view of a CMOS device according to a fifth embodiment of the present invention, and FIGS. 16A and 16B are cross-sectional views of the CMOS device of FIG. 15 taken along lines A-A' and B-B', respectively, of FIG. 15.

Referring to FIGS. 15-16B, an NMOS active region 420' and a PMOS active region 430 are defined by a STI 410 formed into a substrate 400. The STI 410 is formed from a material having tensile stress as described in the fourth embodiment.

Unlike in the fourth embodiment, since a width WAN of the NMOS active region 420' is less than a width $W_{AP}$ of the PMOS active region 430 throughout the entire length of the NMOS active region 420', the width $W_{AN}$ is not sufficiently great to form a source/drain contact 490 of an NMOS transistor. Thus, the CMOS device further includes a contact auxiliary pattern 500 that is formed on the NMOS active region 420' and extends to an adjacent STI 410. The contact auxiliary pattern 500 may be an epitaxial pattern or a buffer poly pattern. While FIGS. 15-16B show that the contact auxiliary pattern 500 is formed only on the NMOS active region 420', it may be formed on the PMOS active region 430 as well.

The PMOS transistor includes a gate 450 and a source/drain region 470 formed within the PMOS active region 430. The source/drain region 470 includes an extended source/drain region 455 aligned with the gate 450 and a deep source/drain region 460 aligned with the gate 450 and a gate sidewall spacer 450S.

The NMOS transistor includes the gate 450 and a source/drain region 472. The source/drain region 472 includes an extended source/drain region 457 that is formed in the NMOS active region 420' aligned with the gate 450 and an elevated deep source/drain region 462 that is formed in the NMOS active region 420' and the contact auxiliary pattern 500 and is aligned with the gate 450 and the gate sidewall spacer 450S. If necessary, before forming the contact auxiliary pattern 500, the deep source/drain region 462 may be formed only within the NMOS active region 420'.

The CMOS device may further include a capping insulating layer 452 that is formed on the gate 450 and protects the top surface of the gate 450 when forming the contact auxiliary pattern 500. The source/drain contact 490 of the PMOS transistor is formed in an interlevel dielectric layer 480 overlying the PMOS active region 430 and connected to the source/drain region 470. In contrast, the source/drain contact 490 of the NMOS transistor is formed in the interlevel dielectric layer 480 overlying the contact auxiliary pattern 500 and connected to the source/drain region 472 through the contact auxiliary pattern 500.

Figure 17:
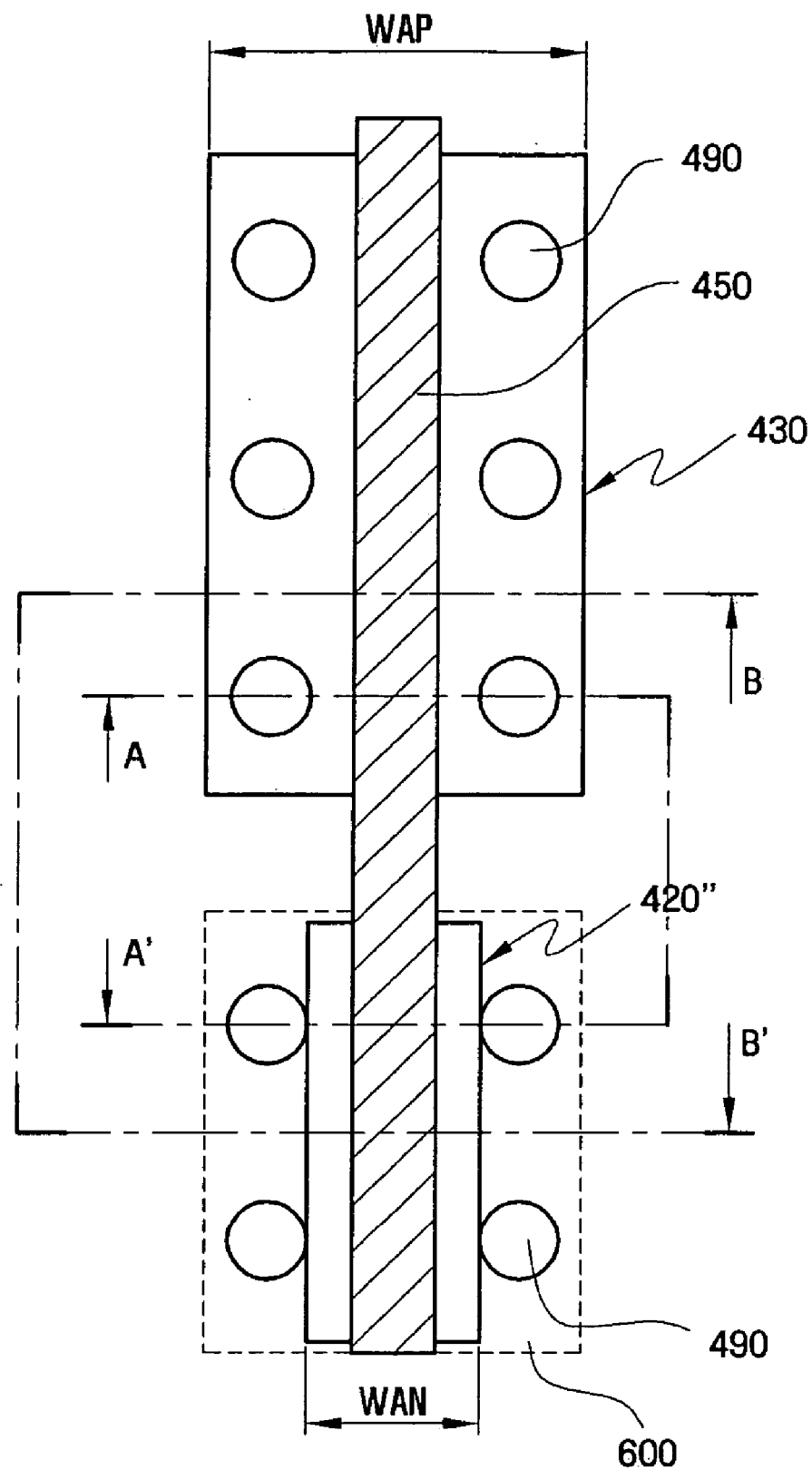
FIG. 17 is a layout view of a CMOS device according to a sixth embodiment of the present invention.
Figure 18A:
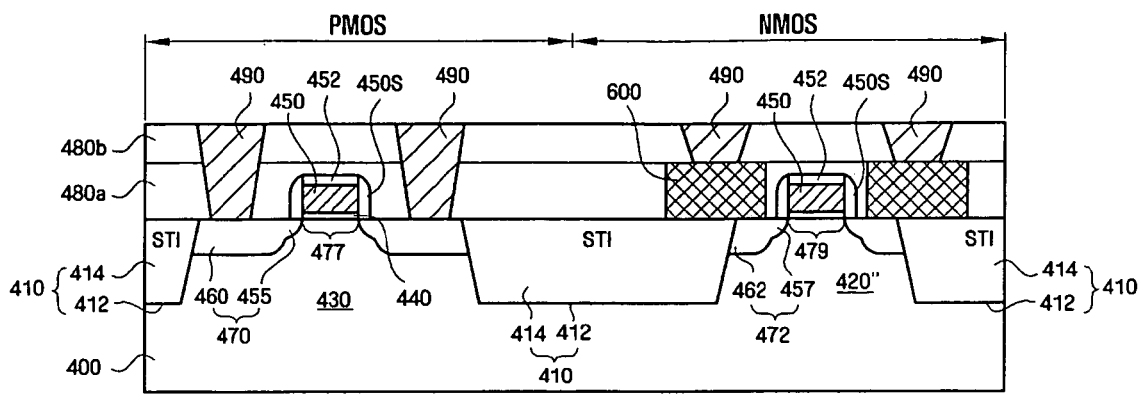
FIGS. 18A and 18B are cross-sectional views showing the CMOS device of FIG. 17 taken along lines A-A' and B-B', respectively, of FIG. 17
Figure 18B:
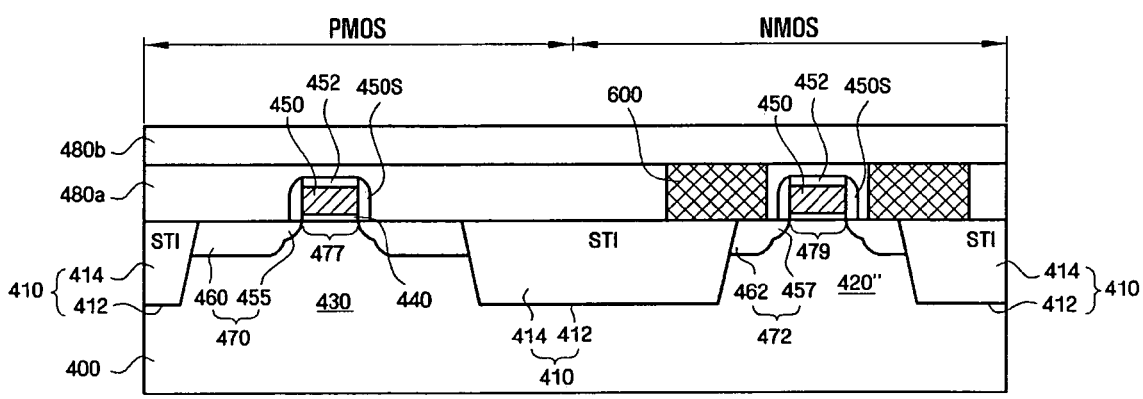

FIG. 17 is a layout view of a CMOS device according to a sixth embodiment of the present invention, and FIGS. 18A and 18B are cross-sectional views of the CMOS device of FIG. 17 taken along lines A-A' and B-B', respectively, of FIG. 17.

Referring to FIGS. 17-18B, an NMOS active region 420" and a PMOS active region 430 are defined by a STI 410 formed into a substrate 400. The STI 410 is formed from a material having tensile stress as described in the fourth embodiment.

As in the fifth embodiment, since a width $W_{AN}$ of the NMOS active region 420" is less than a width $W_{AP}$ of the PMOS active region 430 throughout the entire length of the NMOS active region 420", the width $W_{AN}$ is not sufficiently great to form a source/drain contact 490 of an NMOS transistor. Thus, the CMOS device further includes a contact auxiliary pattern 600 that is formed on the NMOS active region 420" and extends to an adjacent STI 410. The contact auxiliary pattern 600 may be a local interconnect formed in a first interlevel dielectric layer 480a. While FIGS. 17-18B show that the contact auxiliary pattern 600 is formed only on the NMOS active region 420", it may be formed on the PMOS active region 430 as well.

The NMOS transistor includes a gate 450 and a source/drain region 472 formed within the NMOS active region 420". The source/drain region 472 includes an extended source/drain region 457 aligned with the gate 450 and a deep source/drain region 462 that is aligned with the gate 450 and a gate sidewall spacer 450S and connects with the contact auxiliary pattern 600.

The PMOS transistor includes the gate 450 and a source/drain region 470 formed within the PMOS active region 430. The source/drain region 470 includes an extended source/drain region 455 aligned with the gate 450 and a deep source/drain region 460 aligned with the gate 450 and the gate sidewall spacer 450S.

The CMOS device may further include a capping insulating layer 452 that is formed on the gate 450 and protects the top surface of the gate 450 when forming the contact auxiliary pattern 600.

The source/drain contact 490 of the NMOS transistor is formed in a second interlevel dielectric layer 480b overlying the contact auxiliary pattern 600 and connected to the source/drain region 472 through the contact auxiliary pattern 600.

In contrast, the source/drain contact 490 of the PMOS transistor is formed in the first and second interlevel dielectric layers 480a and 480b overlying the PMOS active region 430 and connected to the source/drain region 470.

A method of fabricating a CMOS according to the present invention will now be described. Descriptions of well-known process steps for fabrication of a CMOS device, device structures, and techniques will not be given to clarify the scope of the present invention by avoiding vague interpretation of the present invention. Reference numbers in the drawings are shown as reference numbers of the first through third (reference numbers of the fourth through sixth) embodiments of the present invention.

FIGS. 19A-19D are cross-sectional views showing a method of forming a STI in the CMOS devices according to the embodiments of the present invention.

Figure 19A:
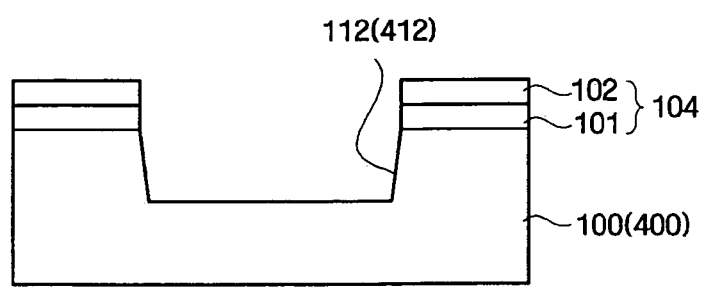
FIGS. 19A-19D are cross-sectional views showing a method of forming a STI in the CMOS devices according to the embodiments of the present invention.

Referring to FIG. 19A, a mask pattern 104 is formed in a semiconductor substrate 100 (400) and exposes a region where a STI 110 (410) will be formed. The mask pattern 104 may include a thermal oxide pattern 101 and a nitride pattern 102 formed in a stack. If the STI 110 (410) is filled with a material having compressive stress during a subsequent process, the mask pattern 104 is formed using the layouts of the CMOS devices according to the first through third embodiments of the present invention shown in FIGS. 3, 7, 8, and 10. On the other hand, if the STI 110 (410) is filled with a material having tensile stress, the mask pattern 104 is formed using the layouts of the CMOS devices according to the fourth through sixth embodiments of the present invention shown in FIGS. 13, 15, and 17. Using the mask pattern 104 as an etch mask, the substrate 100 (400) is then anisotropically dry-etched to a trench 112 (412) defining an active region. The trench 112 (412) may have an aspect ratio to enable void-free filling of the trench 112 (412).

Figure 19B:
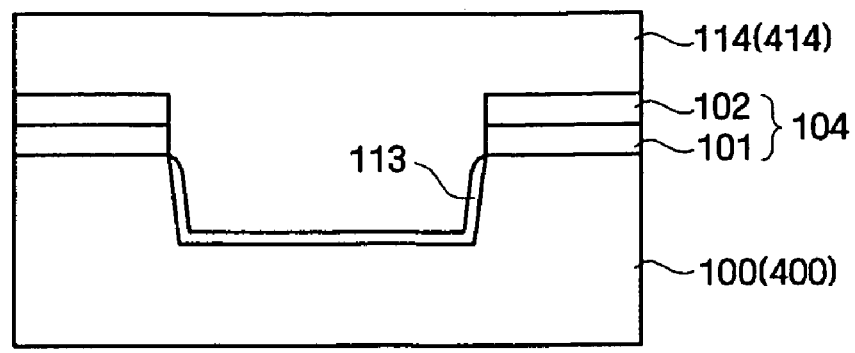

Referring to FIG. 19B, a liner 113 is formed along inner walls of the trench 112 (412) to protect the inner walls. The liner 113 may be a thermal oxide layer or a stack of thermal oxide layer and nitride layer. Subsequently, the insulating material 114 is buried in the trench 112 (412). When the insulating material 114 is a material having compressive stress, the insulating material 114 may be TEOS-$O_3$ based PECVD oxide formed by PECVD using TEOS gas and $O_3$ as reactive gases, $SiH_4$ based PECVD oxide formed by PECVD using $SiH_4$ and $O_2$ as reactive gases, or high density plasma oxide formed by high density plasma (HDP) using $SiH_4$ and $O_2$ as reactive gases while using inert gas (e.g., Ar) as a sputtering gas. Alternatively, the insulating material 114 may be a SiON layer (See FIG. 5) having a nitride with a molar fraction of less than 0.05, formed by low pressure CVD (LPCVD) using dichlorosilane (DCS), ammonia, and nitrate as reactive gases.

Conversely, when the insulating material 414 is a material with tensile stress, the insulating material 414 may be may be TEOS-$O_3$ based CVD oxide formed by CVD using TEOS gas and $O_3$ as reactive gases, or a SiON layer (See FIG. 5) formed by LPCVD with a nitride having molar fraction of greater than 0.05.

Figure 19C:
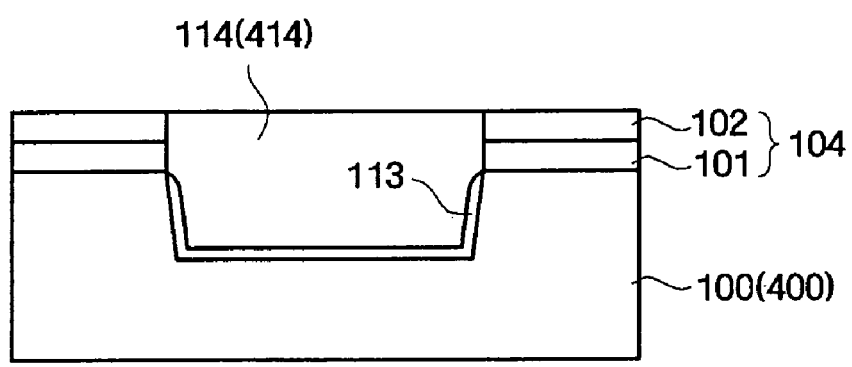

Referring to FIG. 19C, the top surface of the insulating material 114(414) is planarized to a level that is substantially co-planar with the top surface of the mask pattern 104 using, for example, chemical mechanical polishing (CMP) or etch-back process.

Figure 19D:
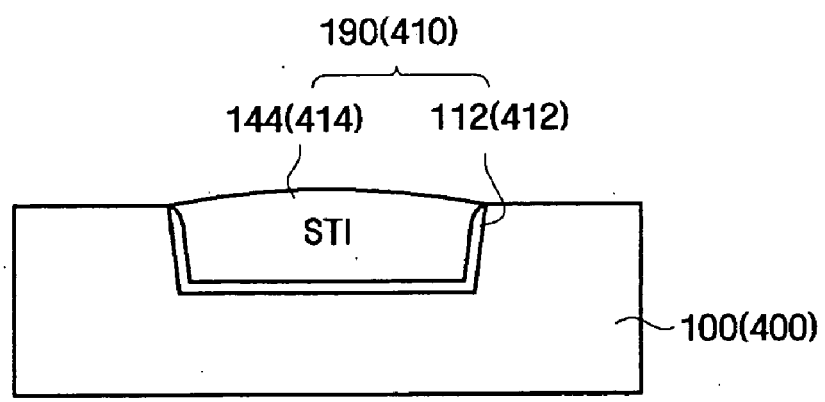

Referring to FIG. 19D, the mask pattern 104 is removed to form the STI 110 (410) defining an NMOS active region 120 (420, 420', or 420") and a PMOS active region 130, 130', or 130" (430) according to the first through third (fourth through sixth) embodiments. The nitride pattern 102 in the mask pattern 104 is stripped using phosphoric acid while the thermal oxide pattern 101 is removed using a buffer oxide etchant (BOE).

For a subsequent process of forming PMOS and NMOS transistors in the CMOS device, various modifications can be made thereto. Thus, the subsequent process for forming PMOS and NMOS transistors will now be described without reference to separate drawings.

A well can be formed selectively before or after formation of the STI 110 (410), and then an insulating layer is formed from oxide, thermally grown silicon dioxide, nitride, oxynitride, SiLK® polyimide, or high-k material. The high-k material may be $Al_2O_3$, $Ta_2O_5$, $HfO_2$, $ZrO_2$, hafnium silicate, zirconium silicate, or any combination thereof.

After forming on the insulating layer a conductive layer made from polycrystalline silicon (poly-Si), Si—Ge, Ge, or a stack of the materials, the conductive layer and the insulating layer are patterned to form a gate 150 (450) and a gate insulating layer 140 (440). Optionally, n- and p-type impurities may be injected into the NMOS and PMOS gates 150 (450), respectively. For a subsequent process, silicidation may be performed on the gate 150(450), and a capping insulating layer 152 (452) may be formed on the gate 150 (450).

Subsequently, ion implantation is conducted using a gate as a mask to form extended source/drain regions 155 (455) and 157 (457). During ion implantation, n-type impurities such as arsenic (As) and p-type impurities such as boron (B) are respectively introduced into an NMOS active region 120 (420, 420', or 420") and a PMOS active region 130, 130' or 130" (430).

Optionally, to prevent a short channel effect known as punch-through, halo ion implantation may be performed to introduce impurities that have a conductivity type opposite to those of the impurities introduced when forming the extended source/drain regions 155 (455) and 157 (457). That is, p-type impurities such as B and n-type impurities such as As may be respectively injected into the NMOS active region 120 (420, 420', or 420") and the PMOS active region 130, 130' or 130" (430).

Then, a gate sidewall spacer 150S (450S) is formed, followed by ion implantation to form deep source/drain regions 160 (460) and 162 (462). During the ion implantation, n-type impurities such as As and p-type impurities such as B are respectively introduced into the NMOS active region 120 (420, 420', or 420") and the PMOS active region 130, 130' or 130" (430).

In this case, the concentration of impurities and ion implantation energy are higher than those during the ion implantation conducted when forming the extended source/drain regions 155 (455) and 157 (457).

Subsequently, silicidation is performed on source/drain regions 170(470) and 172(472) and/or the gate 150(450).

After the silicidation process, an interlevel dielectric layer 180 (480) is formed over a substrate 100 (400), and a source/drain contact 190 (490) is formed through patterning.

The above-mentioned method is conducted to form the CMOS devices according to the first and fourth embodiments of the present invention.

For the CMOS devices according to the second and fifth embodiments, an additional process is required in forming a contact auxiliary pattern 200 (500) made of an epitaxial pattern or a buffer poly pattern.

Figure 20A:
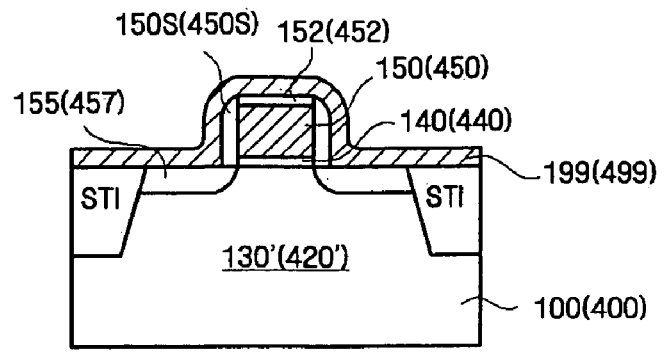
FIGS. 20A-20C are cross-sectional views showing a method of forming the epitaxial pattern or the buffer poly pattern that is a contact auxiliary pattern in the CMOS devices according to the second and fifth embodiments of the present invention.

Referring to FIG. 20A, in order to form a contact auxiliary layer 199 (499), a non-selective epitaxy process or a CVD may be performed over the entire surface of a substrate 100 (400) to form an epitaxial layer or a buffer poly layer, respectively. For the non-selective epitaxy, a capping insulating layer 152 (452) may be formed on a gate 150 (450). The non-selective epitaxy process may be performed by reduced pressure CVD (RPCVD) using $SiH_2Cl_2$ or $SiH_4$ as a precursor or ultrahigh vacuum-CVD (UHV-CVD) using $Si_2H_6$ as a precursor.

Figure 20B:
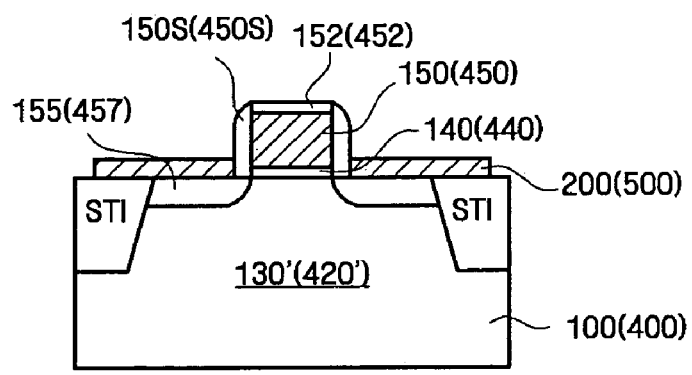

Referring to FIG. 20B, the contact auxiliary layer 199 (499) is patterned to form the contact auxiliary pattern 200 (500). In the second and fifth embodiments, the contact auxiliary layers 199 and 499 are patterned such that the contact auxiliary patterns 200 and 500 remain on portions of STIs 110 adjacent to the PMOS active region 130' and the NMOS active region 420', respectively. Although not shown in the drawings, the contact auxiliary patterns 200 and 500 may also be formed on the NMOS active region 120 and the PMOS active region 430, respectively.

Figure 20C:
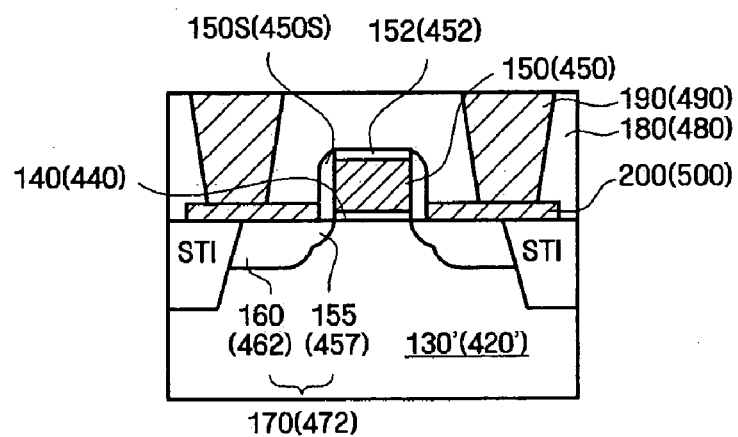

Referring to FIG. 20C, ion implantation is performed using the gate 150 (450) and a gate sidewall spacer 150S (450S) as a mask to form a deep source/drain region 160 (462) within the active region 130 (420') and the contact auxiliary pattern 200 (500).

In this case, the contact auxiliary pattern 200 (500) enables the deep source/drain region 160 (462) to be formed as shallowly as possible.

If necessary, the deep source/drain region 160 (462) and the contact auxiliary pattern 200 (500) may be sequentially formed, followed by ion implantation into the contact auxiliary pattern 200 (500), thereby making the contact auxiliary pattern 200 (500) have a predetermined conductivity.

Subsequently, an interlevel dielectric layer 180 (480) and a contact 190 (490) connecting to the contact auxiliary pattern 200 (500) are sequentially formed on the resultant structure.

The CMOS devices according to the third and sixth embodiments of the present invention require the following process to form the contact auxiliary pattern 300 (600) made of a local interconnect.

Figure 21A:
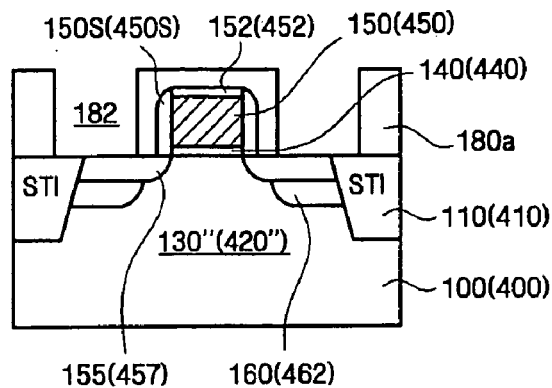
FIGS. 21A-21C are cross-sectional views showing a method of forming a local interconnect that is a contact auxiliary pattern in the CMOS devices according to the third and sixth embodiments of the present invention.

Referring to FIG. 21A, a first interlevel dielectric layer 180a is formed over the entire surface of a substrate 100 (400) having extended source/drain regions 155(455) and 157(457) and deep source/drain regions 160 (462) formed therein. To provide an end point of a subsequent CMP process, a CMP stopper layer may be formed on the first interlevel dielectric layer 180a. Then, the first interlevel dielectric layer 180 is patterned to form an interconnect region 182 formed from an insulating material.

While the interconnect region 182 exposes the STI 110 adjacent to the PMOS active region 130" in the third embodiment, it exposes the STI 410 adjacent to the NMOS active region 420" in the sixth embodiment. Although not shown in the drawings, if necessary, the interconnect region 182 may expose the NMOS active region and the PMOS active region 430 in the third and sixth embodiments, respectively.

Figure 21B:
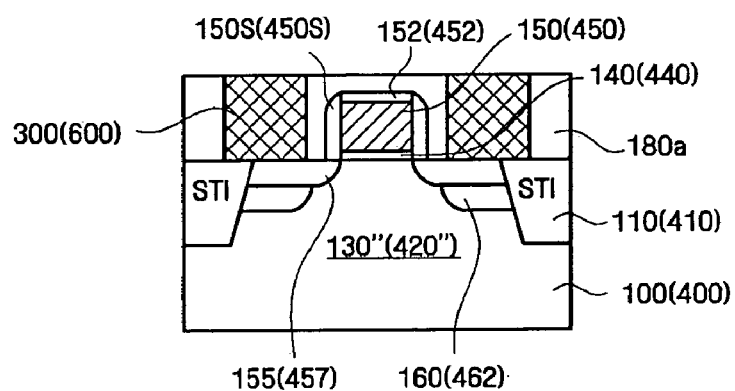

Referring to FIG. 21B, a conductive layer is formed to fill the interconnect region 182 and then planarized to form the contact auxiliary pattern 300 (600) made of a local interconnect. The conductive layer is formed from at least one of Al, Al-alloy, Cu, Au, Ag, W, and Mo by sputtering with reflow, CVD, or electroplating. Electroplating requires a seed layer into which current flows during electrolysis. Before forming the single conductive layer, a diffusion barrier layer may be formed from at least one of Ta, TaN, TiN, WN, TaC, WC, TiSiN, and TaSiN by PVD, CVD, or atomic layer deposition (ALD).

Figure 21C:
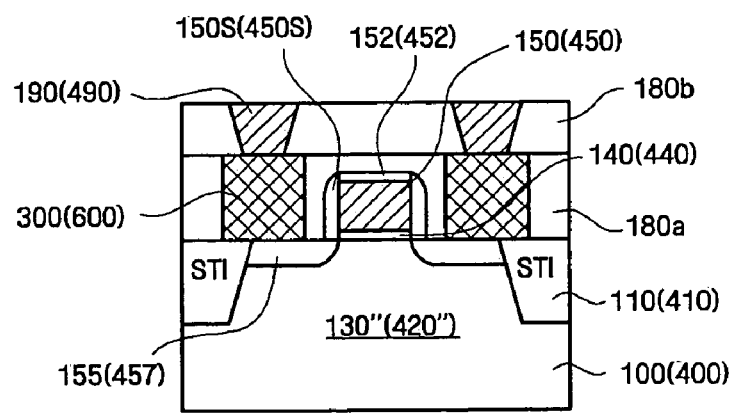

Referring to FIG. 21C, subsequently, a second interlevel dielectric layer 180b and a contact 190 (490) connecting to the contact auxiliary pattern 300 (600) made of the local interconnect are sequentially formed on the resultant structure.

Those skilled in the art will appreciate that many variations and modifications can be made to the preferred embodiments without substantially departing from the principles of the present invention. Therefore, the disclosed preferred embodiments of the invention are used in a generic and descriptive sense only and not for purposes of limitation.

Each of the CMOS devices according to the embodiments of the present invention includes an active region designed to eliminate imbalance in electron and hole mobility by selectively reacting to STI-induced stress favorably acting only upon either electron or hole mobility, thereby providing improved performance.

What is claimed is:

1. A complementary metal oxide semiconductor (CMOS) device comprising:

a first device active region including at least one pair of active regions having a first active region that has a first width and a second active region for forming a contact that has a second width, wherein the first width is less than the second width and the first active region and the second active region are non-overlapping;

a first gate arranged on the first device active region;

a MOS transistor of a first conductivity type including a source/drain region of the first conductivity type formed in the first device active region and the first gate;

a second device active region having a third width greater than the first width;

a second gate arranged on the second device active region; and a MOS transistor of a second conductivity type including a source/drain region of the second conductivity type formed in the second device active region and the second gate, wherein the first width and the third width are configured to substantially balance an electron mobility and a hole mobility in the CMOS device.

2. The CMOS device of claim 1, wherein the first and second device active regions are formed within a substrate and defined by a trench isolation region filled with an insulating material having compressive stress, and the first and second conductivity types are P-type and N-type, respectively.

3. The CMOS device of claim 2, wherein the insulating material having compressive stress is a material selected from the group consisting of TEOS-O3 based PECVD oxide, SiH4 based PECVD oxide, high density plasma oxide, and SiON containing nitride with a molar fraction of less than 0.05.

4. The CMOS device of claim 1, wherein the first and second device active regions are formed within a substrate and defined by a trench isolation region filled with an insulating material having tensile stress, and the first and second conductivity types are N-type and P-type, respectively.

5. The CMOS device of claim 4, wherein the insulating material with tensile stress is one of TEOS-O3 based CVD oxide or SiON containing nitride with a molar fraction of greater than 0.05.

6. The CMOS device of claim 1, wherein the second width is substantially equal to the third width.

7. The CMOS device of claim 1, wherein the same signal is applied to the first and second gates.

8. A complementary metal oxide semiconductor (CMOS) device comprising:

a first device active region having a first width;

a first gate arranged on the first device active region;

a MOS transistor of a first conductivity type including a source/drain region of the first conductivity type formed in the first device active region and the first gate, and a contact auxiliary pattern having a contact region width greater than the first width and overlapping with the first device active region;

a second device active region having a second width greater than the first width;

a second gate arranged on the second device active region; and a MOS transistor of a second conductivity type including a source/drain region of the second conductivity type formed in the second device active region and the second gate, wherein the first width and the second width are configured to substantially balance an electron mobility and a hole mobility in the CMOS device.

9. The CMOS device of claim 8, wherein the contact auxiliary pattern is one of an epitaxial pattern, a buffer poly pattern, or a local interconnect.

10. The CMOS device of claim 8, wherein the first and second device active regions are formed within a substrate and defined by a trench isolation region filled with an insulating material having compressive stress, and the first and second conductivity types are P-type and N-type, respectively.

11. The CMOS device of claim 10, wherein the insulating material having compressive stress is a material selected from the group consisting of TEOS-O3 based PECVD oxide, SiH4 based PECVD oxide, high density plasma oxide, and SiON containing nitride with a molar fraction of less than 0.05.

12. The CMOS device of claim 10, wherein the contact auxiliary pattern is one of an epitaxial pattern or a buffer poly pattern, and the P-type MOS transistor further comprises a contact that is formed on the one of the epitaxial pattern or the buffer poly pattern and connects to the P-type source/drain region through the one of the epitaxial pattern or the buffer poly pattern.

13. The CMOS device of claim 10, wherein the contact auxiliary pattern is a local interconnect, and the P-type MOS transistor further comprises a contact that is formed on the local interconnect and connects to the P-type source/drain region through the local interconnect.

14. The CMOS device of claim 10, wherein the N-type MOS transistor further comprises a contact that is formed on the second device active region and connects to the N-type source/drain region.

15. The CMOS device of claim 8, wherein the first and second device active regions are formed within a substrate and defined by a trench isolation region filled with an insulating material having tensile stress, and the first and second conductivity types are N-type and P-type, respectively.

16. The CMOS device of claim 15, wherein the insulating material with tensile stress is one of TEOS-O3 based CVD oxide or SiON containing nitride with a molar fraction of greater than 0.05.

17. The CMOS device of claim 15, wherein the contact auxiliary pattern is one of an epitaxial pattern or a buffer poly pattern, and the N-type MOS transistor further comprises a contact that is formed on the one of the epitaxial pattern or the buffer poly pattern and connects to the N-type source/drain region through the one of the epitaxial pattern or the buffer poly pattern.

18. The CMOS device of claim 15, wherein the contact auxiliary pattern is a local interconnect, and the N-type MOS transistor further comprises a contact that is formed on the local interconnect and connects to the N-type source/drain region through the local interconnect.

19. The CMOS device of claim 15, wherein the P-type MOS transistor further comprises a contact that is formed on the second active region and connects to the P-type source/drain region.

20. The CMOS device of claim 8, wherein the same signal is applied to the first and second gates.

* * * * *